United States Patent [19]

Kodama et al.

[11] Patent Number: 5,361,266
[45] Date of Patent: Nov. 1, 1994

[54] ERROR CORRECTION CIRCUIT

[75] Inventors: Yukio Kodama; Kazuo Murakami, both of Itami; Hideo Yoshida, Kamakura, all of Japan

[73] Assignee: Mitsubishi Denki Kabushiki Kaisha, Tokyo, Japan

[21] Appl. No.: 138,037

[22] Filed: Oct. 19, 1993

[30] Foreign Application Priority Data

Nov. 4, 1992 [JP] Japan ............................... 4-294853

[51] Int. Cl.⁵ ............................................ G06F 11/10
[52] U.S. Cl. ..................................................... 371/37.7
[58] Field of Search ................... 371/37.7, 37.4, 37.5, 371/37.1, 40.1

[56] References Cited

U.S. PATENT DOCUMENTS

| | | | |
|---|---|---|---|
| 5,027,357 | 6/1991 | Yu et al. | 371/37.7 |
| 5,068,857 | 11/1991 | Yoshida | 371/37.7 |
| 5,157,669 | 10/1992 | Yu et al. | 371/37.7 |
| 5,282,214 | 1/1994 | Oravida | 371/37.7 X |

OTHER PUBLICATIONS

IBM Technical Disclosure Bulletin, vol. 22, No. 6, Nov. 1979, pp. 2365–2368, C. L. Chen, "High–Speed Cyclic Redundancy Checking Scheme for Error Correcting Codes".

*Primary Examiner*—Joseph Ruggiero
*Attorney, Agent, or Firm*—Oblon, Spivak, McClelland, Maier & Neustadt

[57] ABSTRACT

An error correction circuit is capable of performing correction errors in data at a high speed. A syndrome generator (2) calculates syndromes of RS codes based on partial data streams which are given from a data buffer (1). A received CRC generator (13) performs CRC coding on the partial data streams which are given from a data buffer (1) to thereby obtain received CRCs. An error pattern CRC generator (14) calculates error pattern CRCs of the respective partial data stream based on error patterns which are generated by an error pattern generation circuit (33). Under the control of a control circuit (40), the operations performed by the syndrome generator (2), the received CRC generator (13) and the error pattern CRC generator (14) are carried out at the same time. An improvement in the speed of error correction of the partial data streams performed by the error correction means directly leads to an improvement in the speed of the whole error correction.

15 Claims, 14 Drawing Sheets

FIG. 10

| j → | | | | 0 | 1 | 2 | 3 | 4 | i |
|---|---|---|---|---|---|---|---|---|---|
| | SB1 | SB2 | SB3 | D1 | D2 | D3 | D4 | D5 | 103 |
| | | | | D6 | D7 | D8 | D9 | D10 | 102 |
| | | | | D11 | D12 | D13 | D14 | D15 | 101 |
| | | RS1 | | D16 | D17 | D18 | D19 | D20 | 100 |
| | | | | D21 | D22 | D23 | D24 | D25 | 99 |
| | | | | D26 | D27 | D28 | D29 | D30 | 98 |
| | | RS2 | | D31 | D32 | D33 | D34 | D35 | 97 |

104 ROWS

| | RS33 | D496 | D497 | D498 | D499 | D500 | 4 |
|---|---|---|---|---|---|---|---|
| | | D501 | D502 | D503 | D504 | D505 | 3 |
| | | D506 | D507 | D508 | D509 | D510 | 2 |
| | RS34 | D511 | D512 | F1 | F2 | F3 | 1 |
| | | F4 | C1 | C2 | C3 | C4 | 0 |
| | | E1,1 | E2,1 | E3,1 | E4,1 | E5,1 | -1 |
| | RS35 | E1,2 | E2,2 | E3,2 | E4,2 | E5,2 | -2 |
| | | E1,3 | E2,3 | E3,3 | E4,3 | E5,3 | -3 |

16 ROWS

| | RS39 | E1,14 | E2,14 | E3,14 | E4,14 | E5,14 | -14 |
|---|---|---|---|---|---|---|---|
| | | E1,15 | E2,15 | E3,15 | E4,15 | E5,15 | -15 |
| | | E1,16 | E2,16 | E3,16 | E4,16 | E5,16 | -16 |

ERROR CORRECTION CIRCUIT

BACKGROUND OF THE INVENTION

1. Field of the Invention

The present invention relates to an error correction circuit air correcting an error in recording media by performing error correction of a RS (Reed Solomon) code and error detection of a CRC (cyclic redundancy check code).

2. Description of the Prior Art

The continuous servo method and the sample servo method are admitted in the ISO standards as standard servo methods for optical discs. Of the two servo methods, the continuous servo method uses Reed Solomon codes (RS codes) as error correction codes. The Galois field is $GF(2^8)$ and the primitive polynomial $p(X)$ is determined by:

$$p(X) = X^8 + X^5 + X^3 + X^2 + 1 \tag{1}$$

The generator polynomial $Ge(X)$ of the Reed Solomon codes is determined by:

$$Ge(X) = \prod_{j=120}^{135} (X + \alpha^j) \tag{2}$$

On the other hand, the generator polynomial $Gc(X)$ of the CRC codes is defined as:

$$Gc(X) = \prod_{j=136}^{139} (X + \alpha^j) \tag{3}$$

where $\alpha^i = (\beta^i)^{88}$ and $\beta$ is defined as the clement of the primitive polynomial $p(x)$.

FIG. 10 shows the standard 512 bytes per sector data format on an 90 mm optical disk for the continuous servo method which is admitted as a standard servo method in the ISO standards regarding optical discs. The CRC data $C_k$ ($1 \leq k \leq 4$), which are generated by coding the CRCs, are found in the following manner.

First, the information polynomial $Ic(X)$ is expressed as:

$$Ic(X) = \left[ \sum_{i=1}^{103} \left( \sum_{j=0}^{4} B_{ij} X^i \right) \right] + B_{0,0} X^0 \tag{4}$$

In FIG. 10, if expressed as An (recording and reproducing are performed in the order of the integer n), every portion of the data is identified as:

User data byte $Dn = An$ ($1 \leq n \leq 512$);
Pad byte $Fm = An$ ($513 \leq n \leq 516$);
CRC check byte $C_k = An$ ($517 \leq n \leq 520$); and
ECC check byte $Es,t = An$ ($521 \leq n \leq 600$).

The parameters used in Eq. 4 and the parameters m, k, s and t above are defined as:

$m = n - 512$ $k = n - 516$ $s = [(n-521) \bmod 5] + 1$ $t = \text{int}\ [(n-521)/5] + 1 \tag{5}$ $B_{ij} = A_n (1 \leq n \leq 520)$ $i = 103 - \text{int}\ [(n-1)/5]$ $j = (n-1) \bmod 5$ In FIG. 10, indicated at SB are the synchronization bytes and indicated at RS are the re-synchronization bytes.

Hence, the CRC data $C_k$ are calculated by:

$$Rc(X) = Ic(X)X^4 \bmod Gc(X) \tag{6}$$

$$Rc(X) = \sum_{k=1}^{4} C_k X^{4-k}$$

The ECC data $Es,t$ ($1 \leq s \leq 5$, $1 \leq t \leq 16$) which are generated by coding the Reed Solomon codes are found in the following manner.

First, the information polynomial $Iej(X)$ is expressed as:

$$Iej(X) = \sum_{i=0}^{103} B_{ij} X^i \tag{7}$$

$(0 \leq j \leq 4)$

Hence, the ECC data $Es,t$ are found by:

$$Rej(X) = Iej(X)X^{16} \bmod Ge(X) \tag{8}$$

$$Rej(X) = \sum_{t=1}^{16} E_{j+1,t} X^{16-t}$$

FIG. 14 is a block diagram showing the structure of a CRC circuit (CRC generator). Indicated at reference character 7a is an $\alpha^{40}$ multiplier, indicated at reference character 7b is an $\alpha^{117}$ multiplier, indicated at reference character 7c is an $\alpha^{228}$ multiplier, indicated at reference character 7d is an $\alpha^{97}$ multiplier, indicated at reference characters 8a, 8b, 8c and 8d are registers, indicated at reference character 9 is an adder, indicated at reference character CLK is a clock, indicated at reference character 11 is a data input terminal, and indicated at reference character 12 is a data output terminal.

Though being obtainable by the calculation method above, the CRC data $C_k$ ($1 \leq k \leq 4$) may be calculated in the following manner.

First, the information polynomial $Icj(X)$ regarding each code word is expressed as:

$$Icj(X) = \sum_{i=1}^{103} B_{ij} X^i + B_{0,0} X^0 \tag{9}$$

$(0 \leq j \leq 4)$

The CRC data $C_{kj}$ regarding each code word is found by:

$$Rcj(X) = Icj(X) X^4 \bmod Gc(X) \tag{10}$$

$$Rcj(X) = \sum_{k=1}^{4} (C_{kj}) X^{4-k}$$

Considering that the CRCs are liner, it is understood that the sum of the respective CRC data $C_{kj}$ regarding the respective code words is equal to the above-mentioned CRC data $C_k$. That is, Eq. 11 below holds.

$$C_k = \sum_{j=0}^{4} C_{kj} \quad (11)$$

Now, a method of calculating the CRC data $C_{kj}$ regarding the respective code words will be described with reference to FIG. 14. The code word number 0 (j=0) will be taken as an example. The information polynomial $Ic0(X)$ for the code word number 0, if expressed in accordance with the data format shown in FIG. 10, is:

$$Ic_0(X) = D1X^{103} + D6X^{102} + D11X^{101} \ldots D511X + F4 \quad 12)$$

The CRC circuit of FIG. 14 is in fact a divider. Hence, at the end of serial entry of the data from the data input terminal 11 as D1, D6, D11, ... D511, F4 in accordance with the clock CLK, what is stored in the registers 8a, 8b, 8c and 8d is equal to $\{Ico(X) X^4 \bmod Gc(X)\}$. Therefore, if $$Rc_0(X) = Ic_0(X) X^4 \bmod Gc(X) \quad (13)$$

$$Rc_0(X) = \sum_{k=1}^{4} C_{k0} X^{4-k}$$

the registers 8a, 8b, 8c and 8d store $C_{10}$, $C_{20}$, $C_{30}$ and $C_{40}$, respectively.

FIG. 11 is a block diagram showing the structure of a conventional error correction circuit adopting the CRC method. In FIG. 11, a data buffer is indicated at reference character 1. The data buffer 1 stores received data in which an error to be corrected may be included and corrected data which are obtained after error correction. The received data stored in the data buffer 1 are supplied to a syndrome generator 2 and a CRC generator 5 for every unit of code word number. As shown in FIG. 10, the received data are in the form of data streams in which a plurality of code streams having the CRCs as internal codes and the RS codes as external codes are interleaved. The data streams are classified into a plurality of partial data streams (the vertical data streams of FIG. 10) by the code word numbers. Each partial data stream is coded to include the RS codes.

The syndrome generator 2 calculates a syndrome of the RS codes of a partial data stream of the received data which are stored in the data buffer 1 and outputs the syndrome to an error correction part 4.

In accordance with the syndrome calculated by the syndrome generator 2, the error correction part 4 corrects an error while storing an error location and an error value of the partial data stream in an error location and error value register 3 which is disposed in the error correction part 4.

The CRC generator 5 calculates the CRC in accordance with the partial data stream thus corrected and stored in the data buffer 1 and outputs the CRC to a CRC register 6.

Upon receipt of the CRC of the corrected partial data stream, the CRC register 6 adds data stored therein and the CRC given thereto. The resulting data are then stored in the CRC register 6 to replace the preceding stored data. A total CRC of the whole corrected received data is eventually calculated and outputted by the CRC register 6.

A CRC verification part 35 compares the total CRC which is received from the CRC register 6 with the CRC data which are stored in the data buffer 1 to thereby verify the mis-correction performed by the error correction part 4.

A control circuit 40 supplies a control signal to the syndrome generator 2, the error correction part 4, the CRC generator 5, the CRC register 6 and the CRC verification part 35 to control their operations.

FIGS. 12 and 13 are flow charts showing the error correction performed by the error correction circuit of FIG. 11. In the following, the error correction will be described with reference to FIGS. 12 and 13. The operation hereinafter described is performed under the control of the control circuit 40.

Before starting the sequence, data stored in the CRC register 6 is cleared and received data which may include an error to be corrected is written into the data buffer 1.

First, at a step S1, a code word number counter (not shown in FIG. 11) is set at 0 so that the syndrome generator 2 calculates a syndrome of the partial data stream having a code word number 0 (j=0) of the received data.

If an error is detected, at a step S2, the error correction part 4 derives an error location polynomial and an error value polynomial for the partial data stream having the code word number 0 and calculate the locations and the values of the error from the syndrome which was calculated at the step S1 in accordance with the error location polynomial and the error value polynomial. Next, at a step S3, the error locations and the error values of the partial data stream having the code word number 0 thus found at the step S2 are stored in the error location and error value register 3.

At a step S4, in accordance with the information stored in the error location and error value register 3, the error correction part 4 serially corrects the incorrect partial data stream of the code word number 0 stored in the data buffer 1.

At a step S5, the code word counter increments (a count=j), in response to which the syndrome generator 2 calculates a syndrome of the partial data stream having a code word number j.

Next, at a step S6, the error correction part 4 calculate error locations and error values of the partial data stream having the code word-number j, which is similar to the step S2. At step S7, the error locations and the error values are stored in the error location and error value register 3, similarly to the step S3.

On the other hand, upon completion of the step S5, CRC procedures including the following steps S8 and S9 are performed on a parallel basis with the steps S6 and S7.

At the step S8, the CRC generator 5 calculates the CRC of the corrected partial data stream which has a code word number (j-1) by the afore-mentioned method. At this stage, $\{Ic(X) X^4 \bmod Gc(X)\}$ is calculated as the CRC. At the step S9, the CRC register 6 adds the data stored therein (initially 0) and the CRC which was calculated at the step S8. The result is stored in the CRC register 6 as new data.

The sequence proceeds to a step S10 when the steps S7 and S9 are completed. At the step S10, in accordance with the error locations and the error values stored in the error location and error value register 3, the error correction part 4 serially corrects the incorrect partial data stream having the code word number j stored in the data buffer 1.

At a step S11, whether the code word number count j coincides with the last code word number is decided. If the code word number count j does not coincide with the last code word number, the sequence returns to the step S5, the code word number count j is incremented, and the steps S5 to S9 are performed once again.

Conversely, if it is found that the code word number count j coincides with the last code word number at the step S11, the sequence proceeds to a step S12.

At the step S12, the CRC generator 5 calculates the CRC of the corrected partial data stream having the last code word number (5 in the example shown in FIG. 10) in a similar manner to the step S8.

At a step S13, the CRC register 6 adds the data stored therein and the CRC which was calculated at the step S12 and stores the result as new data to be stored therein.

As a result, the data stored in the CRC register 6 coincide with the CRC data $C_k$ yielded by Eq. 11. At a step S14, the CRC verification part 35 compares the CRC data $C_k$ which were obtained at the step S13 with the CRC data $C_k$ which were generated by the error correction and stored in the data buffer 1 to thereby verify the mis-correction performed using the RS codes.

In the conventional error correction circuit having such a construction above, calculation of a syndrome of the RS codes of the received data having the code word number j (the step S5 of FIG. 12) cannot be performed concurrently with CRC coding of the corrected received data having the code word number (j-1) (the step S8 of FIG. 12). This is because the two steps require that the received data having different code word numbers are read from the one and only data buffer 1.

It then follows that it is error correction based on a syndrome of the received data having the code word number j performed by the error correction part 4 (the steps S6 and S7 of FIGS. 12 and 13) and CRC coding of the received data having the code word number (j-1) performed by the CRC generator 5 (the steps S8 and S9 of FIGS. 12 and 13) that can be performed on a parallel basis.

Hence, no matter how fast the error correction part 4 is capable of performing error correction, the error correction sequence as a whole cannot be finished at an improved speed since CRC coding by the CRC generator 5, which is to be performed simultaneously with the error correction, still remains slow.

SUMMARY OF THE INVENTION

An error correction circuit of a first aspect of the invention comprises (a) a data buffer for storing a data stream in which a plurality of RS codes for correcting: an error in data and CRC codes for detecting an error in the data are interleaved, the data stream being formed by a first to an n-th partial data streams each processed by RS coding, the data streams including CRC data preliminary generated by CRC coding; (b) syndrome generation means for generating syndromes of RS codes in accordance with the partial data streams which have not been corrected yet; (c) first CRC coding means for performing CRC coding on the partial data streams which have not been corrected yet to thereby obtain first CRCs; (d) error correction means for calculating error locations and error values of the partial data streams in accordance with the syndromes and for correcting errors in the partial data streams in accordance with the error locations and the error values; (e) second CRC coding means for generating error patterns of the partial data streams in accordance with the error locations and the error values, coding CRCs of the error patterns and for obtaining second CRCs; (f) adding means for receiving the first or the second CRCs and calculating a total CRC which is a sum of the first or the second CRCs of the partial data streams; (g) CRC verification means for comparing the total CRC with the CRC data of the data stream and for verifying whether the means (d) has performed error correction accurately; and (h) control means for controlling the means (b) to (g) so that the first to the n-th partial data streams are serially processed and generation of a syndrome performed by the means (b) based on a j-th partial data stream ($2 \leq j \leq n$), CRC coding on the j-th partial data stream performed by the means (c) and CRC coding on an error pattern of a (j-1)-th partial data stream performed by the means (e) are carried out simultaneously, and so that the means (g) performs verification after the means (e) has finished CRC coding on an error pattern of the n-th partial data stream.

The error correction means (d) preferably comprises (d-1) memory means for storing each error location and the corresponding error value as a pair of information. The second CRC coding means (e) preferably comprises: (e-1) error pattern generation means for generating the error patterns in accordance with the error locations and the error values which are stored in the memory means (d-1); and (e-2) error pattern CRC coding means for performing CRC coding on the error patterns and outputting the second CRCs.

The memory means (d-1) preferably stores the error locations and the error values so that the error locations are stored at addresses in an ascending order of address. The error pattern generation means (e-1) preferably comprises: (e-1-1) means for serially counting up a location count from an initial location count which indicates the beginning of each partial data stream; (e-1-2) means for outputting a count control signal in accordance with an error location outputted from the memory means (d-1) and the location count, the count control signal consisting of a coincidence and a no-coincidence signals; (e-1-3) means for counting up an address count from an initial address count, which is a count indicating an address beginning location of the memory means (d-1), when the count control signal is the coincidence signal and for outputting the address count to an address input part of the memory means (d-1) so that the memory means (d-1) outputs one of the error locations and the corresponding error value which are stored at an address which is designated by the address count; and (e-1-4) selection means for outputting an error pattern signal which forms the error patterns, the corresponding error values being outputted as the error pattern signal when the count control signal is the coincidence signal, a zero signal indicating a logical value "0" being outputted as the error pattern signal when the count control signal is the no-coincidence signal.

According to a second aspect of the present invention, in the error correction circuit of the first aspect, the error pattern generation means (e-1) further comprises (e-1-5) means for controlling entry of the error patterns into the error pattern CRC coding means (e-2) in accordance with the location count.

According to a third aspect of the present invention, in the error correction circuit of the first aspect, the means (e-1-1) may be an up-counter in which the initial location count is set when an external reset signal is received therein and which counts up the location count in synchronism with the external clock signal.

In the third aspect of the present invention, the means (e-1-2) may be a comparator which receives one of the error locations from the memory means (d-1) as a first input thereto and the location count from the means (e-1-1) as a second input thereto, the comparator comparing the first input with the second input and outputting the result as the count control signal.

In the third aspect of the present invention, the means (e-1-3) may be an up-counter in which the initial address count is set when an external reset signal is received therein and which counts up the location count in synchronism with the coincidence signal which is outputted as the count control signal.

In the third aspect of the present invention, the means (e-1-5) may be a clock control circuit which receives the external clock signal and supplies a clock signal to the error pattern CRC coding means (e-2) in accordance with the external clock signal, supply of the clock signal to the error pattern CRC coding means (e-2) being controlled in accordance with the location count.

According to a fourth aspect of the present invention, in the error correction circuit of the second aspect, the memory means (d-1) stores the error locations and the error values at addresses in an ascending order of address, and the error pattern generation means (e-1) comprises: (e-1-1) means for serially counting up a location count from an initial location count, the initial location count being a minimum location count which indicates a minimum error location of the error locations which are stored in the memory means (d-1); (e-1-2) means for outputting a count control signal in accordance with an error location outputted from the memory means (d-1) and the location count, the count control signal consisting of a coincidence and a no-coincidence signals; (e-1-3) means for counting up an address count from an initial address count, which is a count indicating an address beginning location of the memory means (d-1), when the count control signal is the coincidence signal and for outputting the address count to an address input part of the memory means (d-1) so that the memory means (d-1) outputs one of the error locations and the corresponding error value which are stored at an address which is designated by the address count; and (e-1-4) selection means for outputting an error pattern signal which forms the error patterns, the corresponding error values being outputted as the error pattern signal when the count control signal is the coincidence signal, a zero signal indicating a logical value "0" being outputted as the error pattern signal when the count control signal is the no-coincidence signal.

In the fourth aspect of the present invention, the means (e-1-1) may be an up-counter in which the initial location count is set when a data load signal which indicates the minimum location count is received therein and which counts up the location count in synchronism with an external clock signal.

An error correction circuit according to a fifth aspect of the present invention comprises (a) a data buffer for storing a data stream in which a plurality of RS codes for correcting an error in data and CRC codes for detecting an error in the data are interleaved, the data stream being formed by a first to an n-th partial data streams each processed by RS coding, the data streams including CRC data preliminarily generated by CRC coding; (b) syndrome generation means for generating syndromes of RS codes in accordance with the partial data streams which have not been corrected yet; (c) error correction means for calculating error locations and error values of the partial data streams in accordance with the syndromes and for correcting errors in the partial data streams in accordance with the error locations and the error values; (d) pattern synthesizing means for generating error patterns of the partial data streams in accordance with the error locations and the error values and for adding the error patterns and the partial data streams which have not been corrected yet to output synthesized patterns; (e) synthesized CRC coding means for performing CRC coding on the synthesized patterns to thereby obtain synthesized CRCs; (D means for serially receiving the synthesized CRCs and adding up the same to thereby obtain a total CRC; (g) CRC verification means for comparing the total CRC with the CRC data of the data stream and for verifying whether the means (d) has performed error correction accurately; and (h) control means for controlling the means (b) to (g) so that the first to the n-th partial data streams are serially processed and generation of a syndrome performed by the means (b) based on a j-th partial data stream ($2 \leq j \leq n$) and adding up of the j-th partial data stream and the error pattern of the (j-1)-th partial data stream are carried out simultaneously, and so that the means (g) performs verification after the means (c) has finished CRC coding on the last one of the synthesized patterns.

According to a sixth aspect of the present invention, in the error correction circuit of the fifth aspect of the present invention, the error correction means (c) preferably comprises (c-1) memory means for storing each error location and the corresponding error value as a pair of information. The pattern synthesizing means (d) preferably comprises: (d-1) error pattern generation means for generating the error patterns in accordance with the error locations and the error values which are stored in the memory means (c-1); and (d-2) adding means for receiving and adding up the error patterns and the partial data streams which have not been corrected yet to thereby output synthesized patterns.

In the fifth aspect of the present invention, the control means (h) preferably controls such that one of the error patterns which is given to the adding means (d-2) at the same time that the adding means (d-2) receives the first partial data stream which has not been corrected yet is a zero pattern which is formed by a logical value "0" and that the partial data stream which is given to the adding means (d-2) at the same time that the adding means (d-2) receives the error pattern of the n-th partial data stream is the zero pattern.

According to a seventh aspect of the present invention, in the error correction circuit of the sixth aspect of the present invention, the memory means (c-1) preferably stores the error locations and the error values at addresses in an ascending order of address. The error pattern generation means (d-1) preferably comprises: (d-1-1) means liar counting up means for serially counting up a location count from an initial count which indicates the beginning of each partial data stream; (d-1-2) means for outputting a count control signal in accordance with an error location outputted from the memory means (c-1) and the location count, the count control signal consisting of a coincidence and a no-coincidence signals; (d-1-3) means for counting up an address count from an initial count, which is a count indicating an address beginning location of the memory means (c-1), when the count control signal is the coincidence signal and for outputting the address count to an address input part of the memory means (c-1) so that the memory means (c-1) outputs one of the error locations and the corresponding error value which are stored at an address which is designated by the address count; and (d-1-4) selection means for outputting an error pattern signal which forms the error patterns, the corresponding error value being outputted as the error pattern signal when the count control signal is the coincidence signal, a zero signal indicating a logical value "0" being outputted as the error pattern signal when the count control signal is the no-coincidence signal.

As heretofore described, the error correction circuit of a first aspect of the invention comprises: (b) syndrome generation means for generating syndromes of RS codes in accordance with an uncorrected partial data streams; (c) first CRC coding means for performing CRC coding on the partial data streams which have not been corrected yet to thereby obtain first CRCs; and (e) second CRC coding means for coding CRCs of the error patterns which are generated in accordance with the error locations and the error values and for obtaining second CRCs.

The syndrome generation means (b) and the first CRC coding means (c) perform the operations based on the same uncorrected partial data stream. The second CRC coding means (e) is capable of performing the operation independently of the operations of the syndrome generation means (b) and the first CRC coding means (c). Hence, under the control of the control means (h), generation of a syndrome performed by the syndrome generation means (b) based on a j-th partial data stream ($2 \leq j \leq n$), CRC coding on the j-th partial data stream performed by the first CRC coding means (c) and CRC coding on an error pattern of a (j-1)-th partial data stream performed by the second CRC coding means (e) are carried out simultaneously without causing any problem.

Hence, by performing these operations simultaneously, an improvement in the speed of error correction of the partial data streams performed by the error correction means (d) directly leads to an improvement in the speed of the whole error correction.

The error correction circuit of a fifth aspect of the invention comprises: (b) syndrome generation means for generating syndromes of RS codes in accordance with an uncorrected partial data streams; and (d) pattern synthesizing means for adding the error patterns and the uncorrected partial data streams to output synthesized patterns.

The data needed by the syndrome generation means (b), i.e., one input to be given to the pattern synthesizing means (d), are the same uncorrected partial data stream. The other input to be given to the pattern synthesizing means (d) are the error pattern which can be transferred completely independently of the operation of the syndrome generation means (b). Hence, under the control of the control means (h), generation of a syndrome performed by the syndrome generation means (b) based on a j-th partial data stream ($2 \leq j \leq n$) and adding up of the j-th partial data stream and the error pattern of the (j-1)-th partial data stream can be carried out simultaneously without any problem.

It then follows that by performing these operations simultaneously, an improvement in the speed of error correction of the partial data streams performed by the error correction means (c) directly leads to an improvement in the speed of the whole error correction.

Accordingly, it is an object of the present invention to offer an error correction circuit which is capable of performing correction of data errors at a high speed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a view showing the standard 512 bytes per sector data format on an 90 mm optical disk for the continuous servo method which is admitted as a standard servo method in the ISO standards regarding optical discs;

DESCRIPTION OF THE PREFERRED EMBODIMENTS

1. First Preferred Embodiment 1.1 Principles of First Preferred Embodiment

From Eqs. 10 and 11, it is known that the CRC data $C_k$ is obtainable by calculating the CRC data $C_{kj}$ of the partial data stream having the code word number j and adding up the respective CRC data $C_{kj}$.

Assuming that the information polynomial is I(X), the division polynomial is P(X) and the remainder obtainable by dividing the polynomial I(X) by the polynomial P(X) is C(X), Eq. 14 as below is derived.

$$C(X) = I(X) \bmod P(X) \qquad 14$$

In general, since the information polynomial I(X) is a sum of the received data polynomial RE(X) and the error polynomial E(X), Eq. 14 can be expressed as Eq. 15 or even as Eq. 16.

$$C(X) = [RE(X) + E(X)] \bmod P(X) \qquad 15$$

$$C(X) = RE(X) \bmod P(X) + E(X) \bmod P(X) \qquad 16$$

Hence, if the received data having the code word number j is REj(X) and an error pattern polynomial of the partial data stream having the code word number j is Ej(X), from Eqs. 10, 11 and 16, Eq. 17 as below holds:

$$Rc(X) = \sum_{j=0}^{4} [RE_j(X)X^4 \bmod Gc(X) + E_j(X)X^4 \bmod Gc(X)] \quad (17)$$

The first term on the right hand side of Eq. 17 stands for the sum of the CRCs of the received data while the second term on the right hand side of Eq. 17 stands for the sum of the CRCs of the error patterns of the received data.

Based on the concept heretofore described, the CRCs of the respective partial data streams of the uncorrected received data and the CRCs of error patterns of the respective partial data streams of the corrected received data are calculated separately to eventually calculate the CRC of the whole corrected received data. This is what is performed in the first preferred embodiment.

1.2 Structure of First Preferred Embodiment

Figure 1:
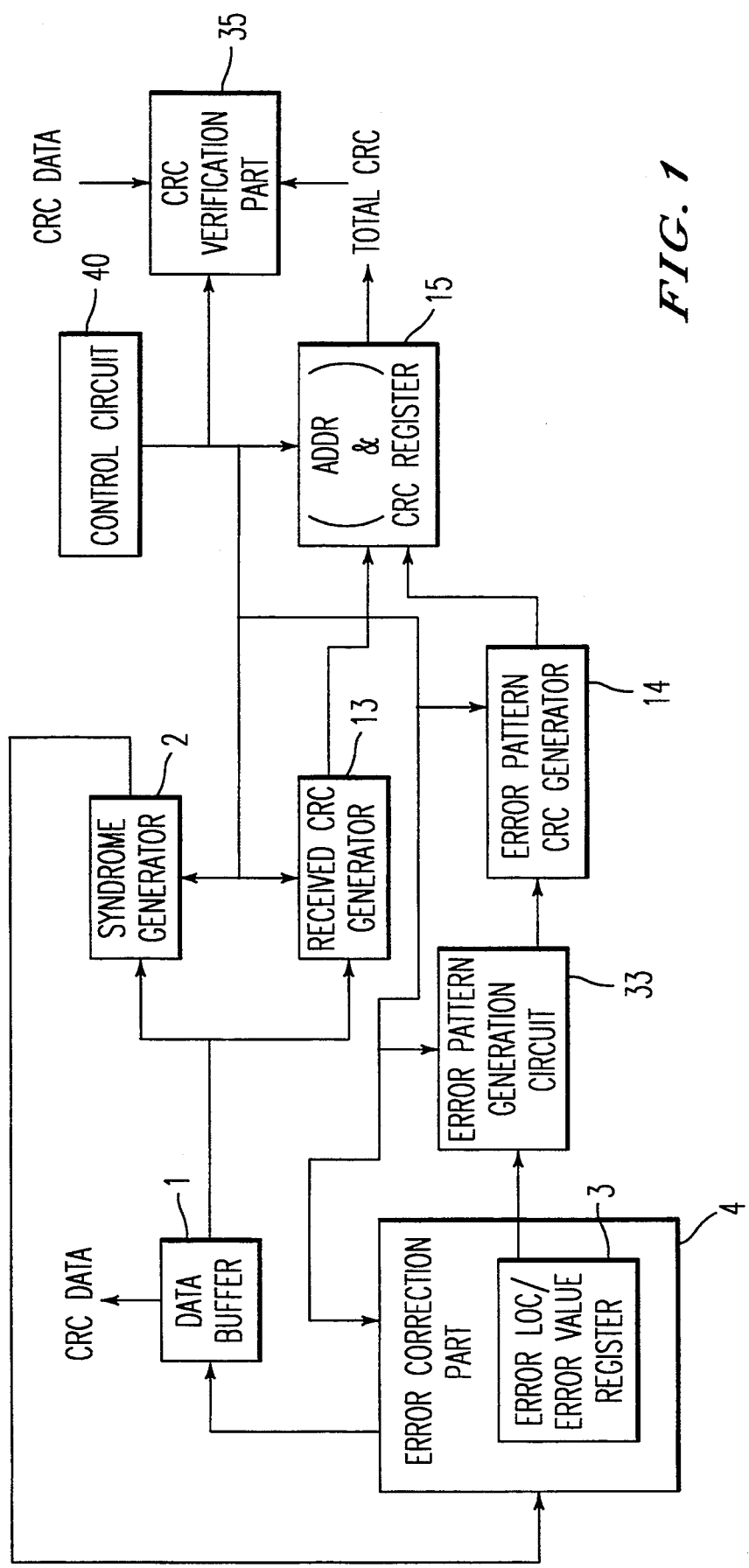
FIG. 1 is a block diagram showing the structure of an error correction circuit according to a first preferred embodiment of the present invention.

FIG. 1 is a block diagram showing the structure of the error correction circuit of the first preferred embodiment of the present invention. In FIG. 1, indicated at reference character 1 is a data buffer for storing received data which is assumed to include an error to be corrected and corrected data which are obtainable by error correction. As shown in FIG. 10, the received data are in the form of data streams in which a plurality of code streams having the CRCs as internal codes and the RS codes as external codes are interleaved. The data streams are classified into a plurality of partial data streams by the code word numbers. Each partial data stream is coded to include the RS codes.

The partial data streams of the received data stored in the data buffer 1 are given to the syndrome generator 2 and a received CRC generator 13 in the order of the code word number.

The syndrome generator 2 calculates a syndrome of the RS codes based on a partial data stream.

The error correction part 4 corrects an error in the partial data stream while storing an error location and an error value of the partial data stream in the error location and error value register 3 which is disposed in the error correction part 4.

The received CRC generator 13 performs CRC coding on the partial data stream, thereby calculating a received CRC and outputting the same to a CRC register 15.

An error pattern generation circuit 33 generates an error pattern based on the error location and the error value stored in the error location and error value register 3 (described later) and outputs the error pattern to an error pattern CRC generator 14.

The error pattern CRC generator 14 performs CRC coding on the error pattern which is received from the error pattern generation circuit 33 to thereby calculate an error pattern CRC which will be then outputted to the CRC register 15.

The CRC register 15, equipped with addition function, adds the data which are stored therein, the received CRC and the error pattern CRC which are received thereto. The result is stored in the CRC register 15 as new data. Finally, the CRC register 15 outputs a total CRC of the whole received data.

The verification part 35 compares the total CRC given by the CRC register 15 with the CRC data which are stored in the data buffer 1 to thereby detect the mis-correction performed by the mis-correction circuit 4.

The syndrome generator 2, the error correction part 4, the received CRC generator 13, the error pattern CRC generator 14, the CRC register 15, the error pattern generation circuit 33 and the CRC verification part 35, receiving a control signal from the control circuit 40, operate under the control of the control circuit 40.

1.3 Operation in First Preferred Embodiment

Figure 2:
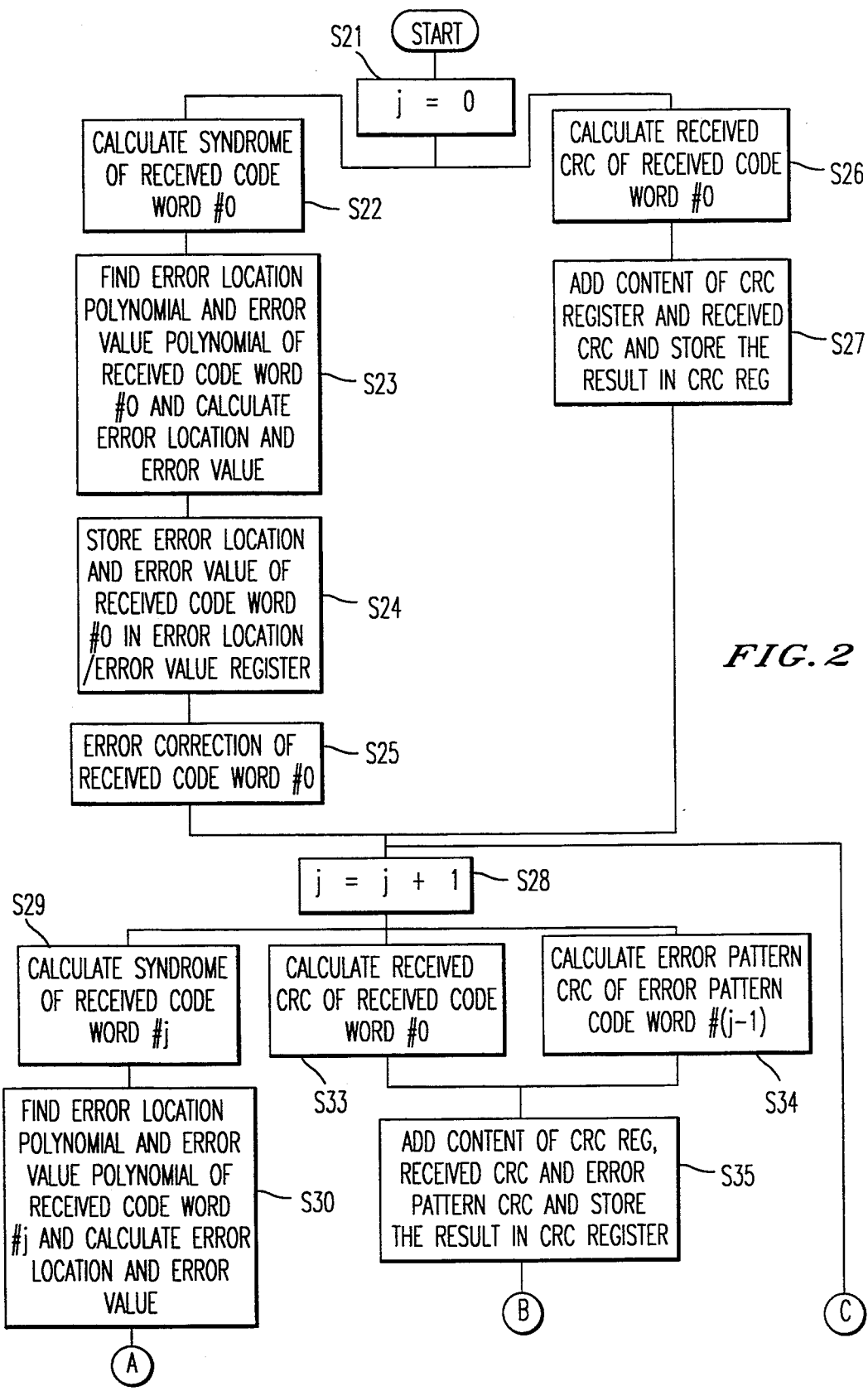
FIGS. 2 and 3 are flow charts showing the operation of the first preferred embodiment of the present invention shown in FIG. 1.
Figure 3:
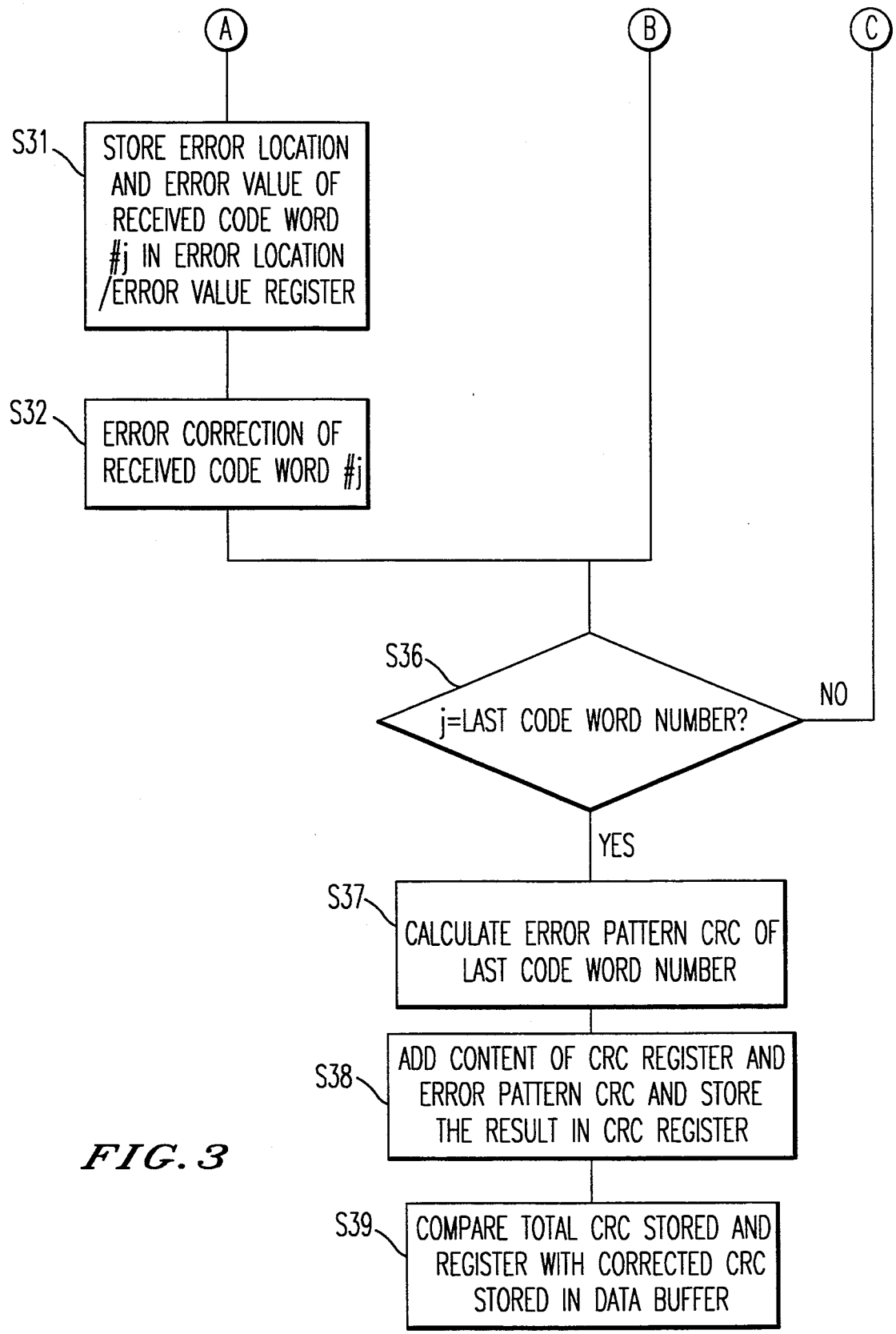

FIGS. 2 and 3 are flow charts showing error correction performed by the error correction circuit of the first preferred embodiment shown in FIG. 1. In the following, the error correction will be described with reference to FIGS. 2 and 3. The operation hereinafter described is performed under the control of the control circuit 40.

Prior to the error correction, data stored in the adding-function-equipped CRC register 15 are cleared and received data which may include an error to be corrected are written into the data buffer 1.

First, at a step S21, a code word number counter j disposed within the control circuit 40 is zeroed.

At a step S22, the syndrome generator 2 calculates a syndrome of the partial data stream having a code word number 0 (j=0).

If an error is detected, at a step S23, the error correction part 4 calculates the location and the value of the error of the partial data stream having the code word number 0 from the syndrome which was calculated at the step S22. At a step S24, the error location and the error value are stored in the error location and error value register 3.

At a step S25, in accordance with the information stored in the error location and error value register 3, the error correction part 4 serially corrects the incorrect partial data stream having the code word number 0 stored in the data buffer 1.

On the other hand, on a parallel basis with the steps S22 to S25, the following steps S26 to S27 are performed.

At the step S26, the received CRC generator 13 calculates the received CRC of the partial data stream having the code word number 0 (j=0). Following this, at the step S27, the CRC register 15 adds the data stored therein and the received CRC which was calculated at the step S26. The result is then stored in the CRC register 15 as new data.

It is to be noted that the steps S22 and S26 are performed reading the partial data stream having the code word number 0 alone from the data buffer 1. Hence, even though the data buffer 1 is a single-port buffer, the steps S22 and S26 can be performed under the control of the control circuit 40 in synchronism at the same time by reading the partial data stream having the code word number 0.

When the steps S22 to S25 and the steps S26 to S27 are completed, the sequence proceeds to a step S28 wherein the code word number counter increments (a count=j).

Next, at a step S29, the syndrome generator 2 calculates a syndrome of the RS codes of the partial data stream having a code word number j.

At a step S30, the error correction part 4 calculates an error location and an error value of the partial data stream which has the code word number j. At a step S31, the error location and the error value are stored in the error location and error value register 3. Following this, at a step S32, the error correction part 4 serially corrects the incorrect partial data stream having the code word number j stored in the data buffer 1.

On the other hand, on a parallel basis with the steps S29 to S32, the following steps S33 to S35 below are performed.

At the step S33, the received CRC generator 13 calculates the received CRC of the partial data stream having the code word number j. Simultaneously with this, at the step S34, the error pattern CRC generator 14 calculates the error pattern CRC of the error pattern of the partial data stream having the code word number j which was generated by the error pattern generation circuit 33.

The steps S29 and S33 are performed reading the partial data stream having the same code word number j from the data buffer 1. Hence, even if the data buffer 1 is a single-port buffer, the steps S29 and S33 can be performed at the same time in synchronism by reading the partial data stream having the code word number j under the control of the control circuit 40.

On the other hand, the step S34 is performed using the data which are stored in the error location and error value register 3 and therefore does not need the data which are stored in the data buffer 1. In other words, the step S34 is performed independently of the steps S29 and S33. Hence, the step S34 can be performed on a parallel basis with the steps S29 and S33.

Upon completion of the steps S33 and S34, the sequence proceeds to a step S35 where the CRC register 15 adds the data stored therein, the received CRC and the error pattern CRC together. The result is then stored in the CRC register 15 as new data.

On completion of the steps S29 to S32 and the steps S33 to S35, the sequence proceeds to a step S36. At the step S36, whether the code word number count j coincides with the last code word number is decided. If the code word number count j does not coincide with the last code word number, the sequence returns to the step S28 and the steps S28 to S35 are performed again on the code word number j.

On the contrary, if it is judged that the code word number count j coincides with the last code word number (5 in the example shown in FIG. 10) at the step S36, the sequence proceeds to a step S37.

At the step S37, the error pattern CRC generator 14 calculates the CRC of the error pattern which was generated by the error pattern generation circuit 33 with respect to the partial data stream which has the last code word number. Following this, at a step S38, the CRC register 15 adds the data stored therein and the error pattern CRC which was calculated at the step S37 and stores the result as new data. As a result, the data finally stored in the CRC register 15 coincides with the Rc(X) which is obtainable by Eq. 17.

Next, at a step S39, the CRC verification part 35 compares the data which were finally stored in the CRC register 15 with the CRC data which were corrected by the error correction part 4 and stored in the data buffer 1, thereby deciding whether the errors in the RS codes were accurately corrected by the error correction part 4.

1.4 Effect of First Preferred Embodiment

In the error correction circuit according to the first preferred embodiment having such a construction described above, calculation of the syndrome of the RS codes of the uncorrected partial data stream having the code word number j (the step S29 of FIG. 2) and CRC coding of the uncorrected partial data stream having the code word number j (the step S33 of FIG. 2) are performed reading the partial data stream having the same code word number from the one and only data buffer 1. Hence, the two steps can be performed at the same time.

In addition, the error pattern generation circuit 33 and the error pattern CRC generator 14 perform CRC coding on the error pattern of the partial data stream having the code word number (j-1) (the step S34 of FIG. 2) in accordance with the data which are stored in the error location and error value register 3, which are completely independent of the data that are stored in the data buffer 1. Hence, this CRC coding can be performed simultaneously with the steps S29 and S33.

The steps S29, S33 and S34 take approximately the same time. For the step S35, only a little time is required.

Hence, by performing the steps S30 to S32, i.e., error correction performed by the error correction part 4 using the syndromes. (FIGS. 2 and 3), at a high speed, the time required for the error correction as a whole is reduced accordingly.

Further, in terms of timing, there is no possibility that the error location and error value register 3 will ever finish, at the step S31, storing the error location and the error value of the partial data stream which has the code word number j before the error pattern generation circuit 33 has finished generating the error pattern of the partial data stream that has the code word number (j-1) at the step S33.

1.5 Error Pattern Generation Circuit (First Structure)

Figure 4:
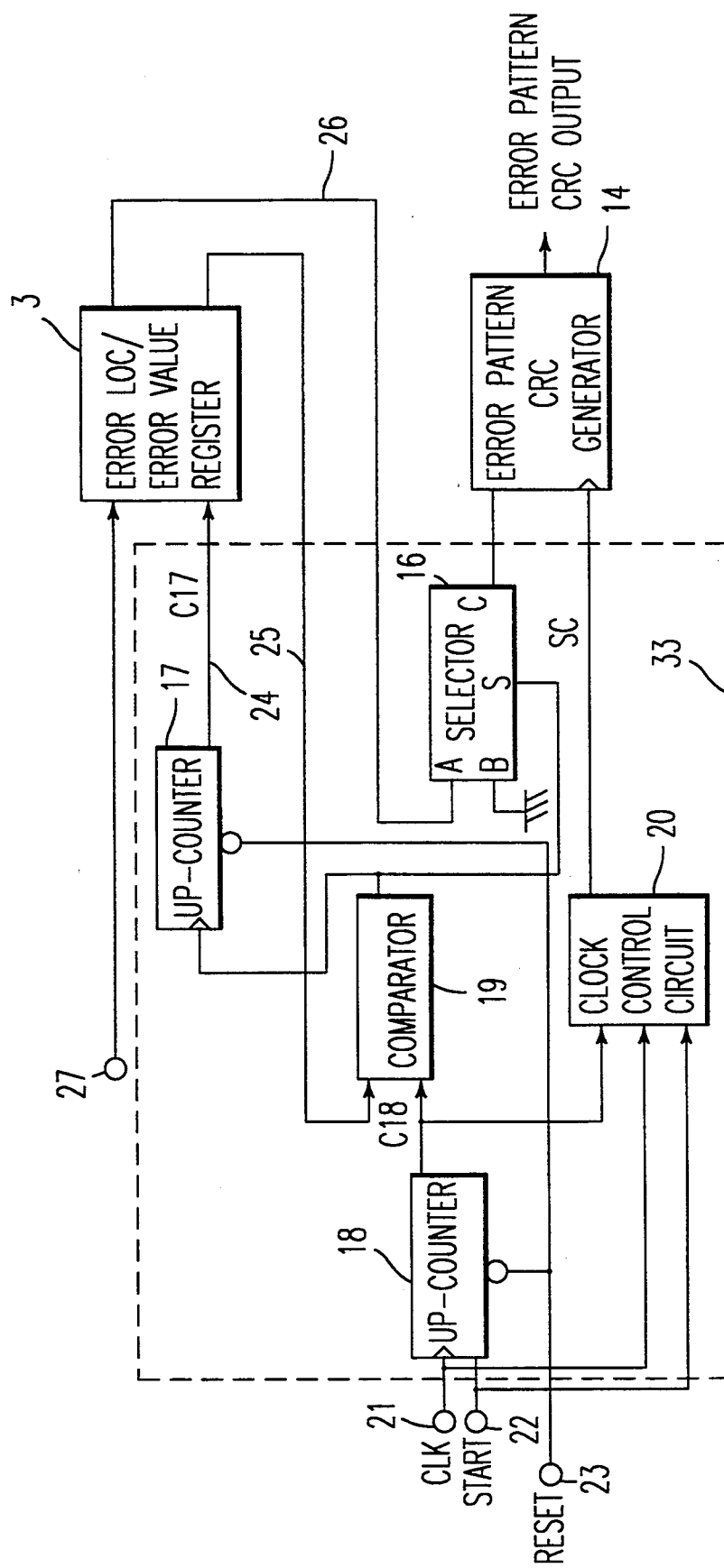
FIG. 4 is a block diagram showing a first structure of an error pattern generation circuit of FIG. 1.

FIG. 4 is a block diagram showing a first structure of the error pattern generation circuit.

The system clock CLK is supplied through a clock input terminal 21 to an up-counter 18 and a clock control circuit 20. A reset input terminal 23 for receiving a reset signal RESET is connected to the up-counter 18 and other up-counter 17. A start terminal 22 for receiving a start signal START is connected to the up-counter 18 and the clock control circuit 20.

The up-counter 18 is initialized upon receipt of the reset signal RESET so that a count thereof is zeroed. In response to the start signal START received therein, the up-counter 18 starts counting up in synchronism with the system clock CLK. The up-counter 18 outputs a count signal C18 which corresponds to a count thereof.

The clock control circuit 20 receives the count signal C18 from the up-counter 18. Further receiving the start signal START, the clock control circuit 20 provides the error pattern CRC generator 14 with a system clock SC which is in synchronism with the system clock CLK. When a predetermined count is reached by the count signal C18 which is given from the up-counter 18, the clock control circuit 20 stops supplying the system clock SC to the error pattern CRC generator 14.

A comparator 19 has a first input which is coupled to an error location data bus 25 of the error location and error value register 3. At its second input, the comparator 19 receives the count signal C18 from the up-counter 18. In accordance with whether the first input and the second input coincide with each other, the comparator 19 outputs a comparison result signal which is formed by a coincidence signal and a no-coincidence signal to the up-counter 17 and an input S of a selector 16.

The up-counter 17 is initialized on receipt of the reset signal RESET to set its count at zero. The up-counter 17 then starts counting up in synchronism with the coincidence signal of the comparison result signal received from the comparator 19. In accordance with a count thereof, the up-counter 17 generates a count signal C17 which will be outputted to an address input part of the error location and error value register 3 through an address bus 24.

In the error location and error value register 3, the error locations and the error values given thereto through an input terminal 27 are stored at certain addresses. The error location and error value register 3 provides the error location data bus 25 and an error value data bus 26 with the error location and the error value, respectively, which are stored at an address which is designated by the count signal C17 which is received through the address bus 24.

An input A of the selector 16 is connected to the error value data bus 26 while an input B of the selector 16 is connected to a ground level ("0"). If the comparison result signal received at the input S from the comparator 19 is the coincidence signal, the selector 16 outputs from its output C the signal which was received at the input A, i.e., the signal on the error value data bus 26, to the error pattern CRC generator 14. If the comparison result signal received at the input S is the no-coincidence signal, the selector 16 outputs from its output C the signal "0" which was received from the input B to the error pattern CRC generator 14.

The error pattern CRC generator 14, in synchronism with the system clock SC received from the clock control circuit 20, serially receives the signals from the output C of the selector 16 as error pattern signals which form the error patterns and calculates the error pattern CRCs.

In the following, generation of the error patterns within the error pattern generation circuit 33 of the first structure will be described with reference to FIG. 4. As mentioned above, the error locations and the error values calculated by the error correction circuit are stored in the error location and error value register 3 through the input terminal 27 under the control of the control circuit 40.

For example, information about the error locations, each expressed by a word-length-direction number (103-i) with respect to a vertical direction i of the data format of FIG. 10, and error values corresponding to the error locations are entered and stored at addresses from a lower address in the register. Assuming that in FIG. 10, D6 (location=1 (103-102)), D16 (location=3 (103-100)) and D31 (location=6 (103-97)) of the partial data stream having the code word number 0 are errors having error values A, B and C, respectively, the error location information and the error value information are stored as paired information as 1-A, 3-B and 6-C at addresses from a lower address in the register (in general, from address 0). The subsequent description assumes that "1-A", "3-B" and "6-C" are stored at addresses 0, 1 and 2, respectively, within the error location and error value register 3.

First, the reset signal RESET is supplied to the reset input terminal 23 to clear counts of the up-counters 17 and 18. In response to the start signal START received at the start input terminal 22, the up-counter 18 starts counting, concurrently with which the system clock SC is supplied to the error pattern CRC generator 14 from the clock control circuit 20.

At this stage, since the up-counter 17 has been just cleared, the count signal C17 having a value "0" is available from the up-counter 17 to the address bus 24. As mentioned above, "1-A" is stored at the address 0 of the error location and error value register 3 as the error location information and the error value information. Hence, the error location and error value register 3 outputs "1" to the error location data bus 25 and "A" to the error value data bus 26.

As a result, the comparator 19 receives at its first input (which is connected to the error location data bus 25) "1" and at its second input (for receiving the count signal C18) "0," whereby the comparison result signal outputted from the comparator 19 is the no-coincidence signal.

This causes that the up-counter 17 receives the no-coincidence signal and maintains its current count. The selector 16, receiving the no-coincidence signal, selects the input B, thereby allowing the error pattern of "0" to be outputted to the error pattern CRC generator 14.

Next, in synchronism with the system clock CLK, the up-counter 18 increments its count to "1."

At this stage, since the up-counter 17 outputs the count signal C17 of "0" to the address bus 24, the error location and error value register 3 keeps outputting "1" to the error location data bus 25 and "A" to the error value data bus 26.

Hence, the comparator 19 receives "1" at its first input and "1" at its second input and outputs the coincidence signal as the comparison result signal.

As a result, the up-counter 17 increments its count by one and the selector 16 selects the input A and outputs "A" to the error pattern CRC generator 14 as the error pattern signal.

Next, in synchronism with the system clock CLK, the up-counter 18 increments its count to "2."

At this stage, since the up-counter 17 increments its count by one and outputs the count signal C17 having a value "2" to the address bus 24, the error location and error value register 3 outputs "3" to the error location data bus 25 and "B" to the error value data bus 26.

Hence, "3" is given to the first input of the comparator 19 and "2" is given to the second input of the comparator 19. Receiving these inputs, the comparator 19 outputs the no-coincidence signal as the comparison result signal.

This causes the up-counter 17 to maintain its count and the selector 16 to select the input B and output "0" to the error pattern CRC generator 14 as the error pattern signal.

Next, the up-counter 18 increments its count to "3" in synchronism with the system clock CLK.

At this stage, the up-counter 17 maintains its count and outputs the count signal C17 having a value "1" to the address bus 24, thereby "3" and "B" remaining available to the address location data bus 25 and the address value data bus 26, respectively.

Hence, the comparator 19 receives "3" both at its first input and at its second input and outputs the coincidence signal as the comparison result signal.

As a result, the up-counter 17 increments its count by one. The selector 16 selects the input A and outputs "B" to the error pattern CRC generator 14 as the error pattern signal.

The sequence as above is continued, during the course of which the selector 16 outputs the error pattern signals as 0, A, 0, B, 0, 0, C, . . . to the error pattern CRC generator 14, whereby the error pattern CRC generator 14 is provided with the error pattern.

When the count indicated by the count signal C18 from the up-counter 18 reaches the code word length, the clock control circuit 20 cuts the supply of the system clock SC to the error pattern CRC generator 14 to thereby end entry of the error pattern into the error pattern CRC generator 14.

Hence, output of the error patterns to the error pattern CRC generator 14 is finished when input of the system clock SC is finished. Almost immediately after having finished receiving the error pattern, the error pattern CRC generator 14 starts calculating the error pattern CRC, or Ej(X) X$^4$ mod Gc(X), based on the error pattern.

1.6 Error Pattern Generation Circuit (Second Structure)

Figure 5:
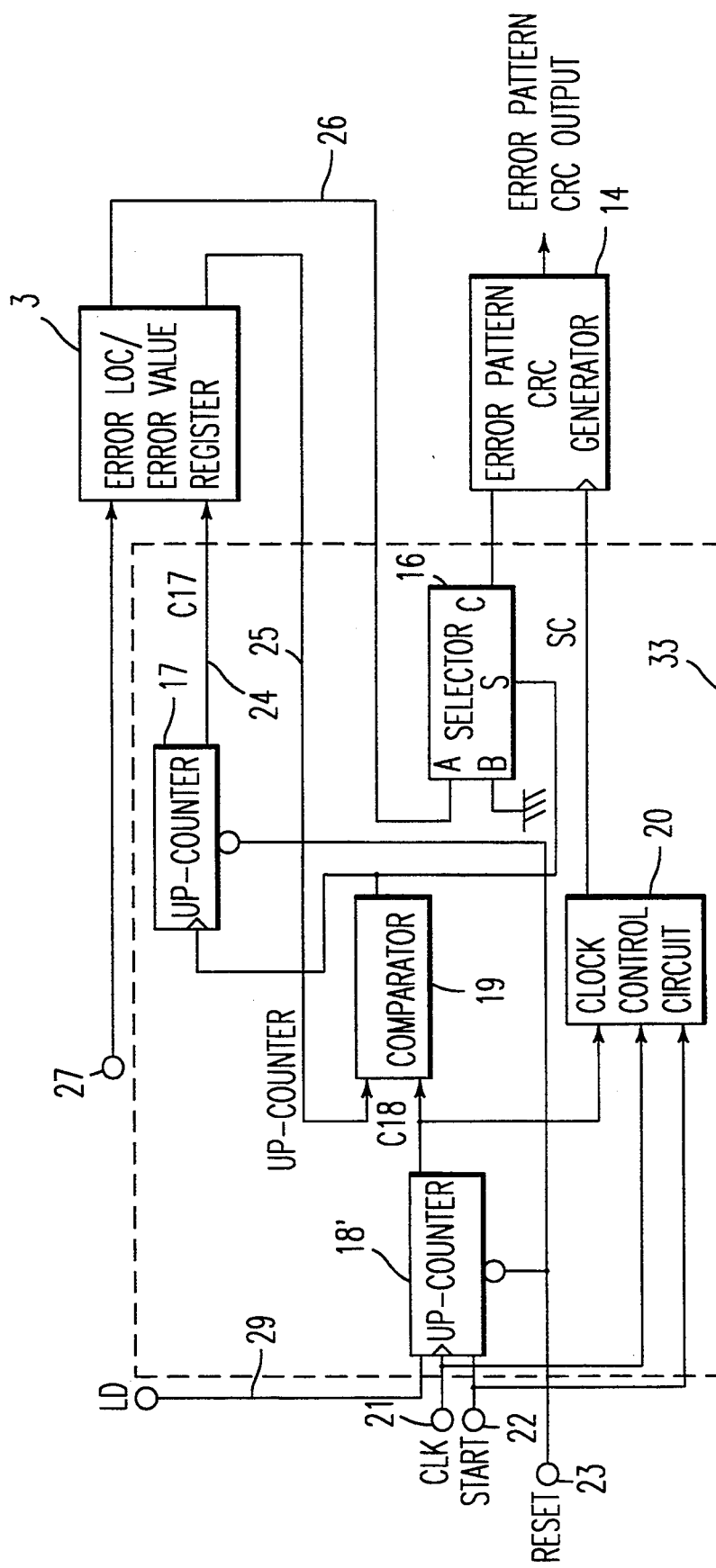
FIG. 5 is a block diagram showing a second structure of an error pattern generation circuit of FIG. 1.

FIG. 5 is a block diagram showing a second structure of the error pattern generation circuit 33. As shown in FIG. 5, likewise in the first structure, an up-counter 18' receives the system clock CLK through the clock input terminal 21, the start signal START through the start terminal 22 and a load signal LD through a load input terminal 29.

A count in the up-counter 18' is determined by the load signal LD. In response to the start signal START received therein, the up-counter 18' starts counting up from an initially set count in synchronism with the system clock CLK.

Figure 6:
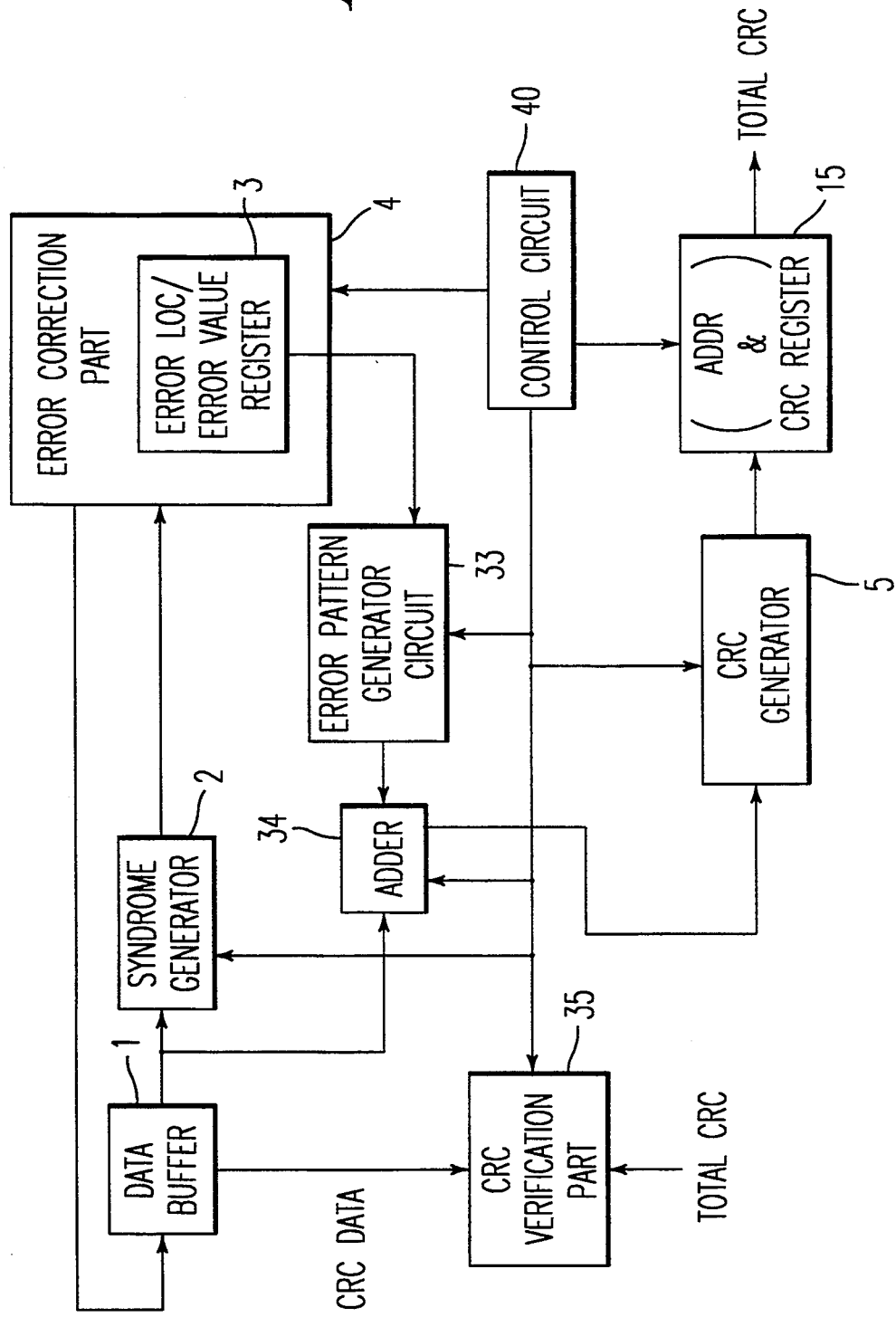
FIG. 6 is a block diagram showing the structure of an error correction circuit according to a second preferred embodiment of the present invention.

In the structure illustrated in FIG. 6, the error correction part 4 comprises a minimum error location output bus (not shown) for outputting a minimum error location as the load signal LD. Since the second structure is otherwise the same as the first structure, similar description will not be given to avoid redundancy.

In the following, error pattern generation within the error pattern generation circuit 33 of the second structure will be described with reference to FIG. 6. As mentioned earlier, the error locations and the error values calculated by the error correction circuit are stored in the error location and error value register 3 through the input terminal 27 under the control of the control circuit 40.

As is done with the first structure, it is assumed that "1-A" is stored at the address 0, "3-B" is stored at the address 1 and "6-C" is stored at the address 2 within the error location and error value register 3.

First, the reset signal RESET is given to the reset input terminal 23, in response to which a count registered by the up-counter 17 is cleared. At the same time, the load signal LD which designates a minimum error location "1" is inputted through the load input terminal 29.

The start signal START received at the start input terminal 22 commences counting up of a count from "1" in the up-counter 18' and supply of the system clock SC from the clock control circuit 20 to the error pattern CRC generator 14.

At this stage, the up-counter 17 stays cleared, and therefore, the count signal C17 from the up-counter 17 to the address bus 24 is "0." As described above, since "1-A" is stored at the address 0 of the error location and error value register 3 as the error location information and the error value information, the error location and error value register 3 outputs "1" to the error location data bus 25 and "A" to the error value data bus 26.

Hence, "1" is given to the first input of the comparator 19 (which is connected to the error location data bus 25) and "1" is given to the second input of the comparator 19 (which receives the count signal C18). Receiving these inputs, the comparator 19 outputs the coincidence signal as the comparison result signal.

In response to the coincidence signal received therein, the up-counter 17 increments its count and the selector 16 selects the input A and outputs "A" to the error pattern CRC generator 14.

The sequence that follows is similar to that within the error pattern generation circuit 33 having the first structure. That is, the selector 16 outputs the error pattern signals as A, 0, B, 0, 0, C, . . . to the error pattern CRC generator 14, whereby the error pattern CRC generator 14 is provided with the error pattern.

When the count indicated by the count signal C18 from the up-counter 18 reaches the code word length, the clock control circuit 20 stops supplying the system clock SC to the error pattern CRC generator 14 to thereby end entry of the error pattern into the error pattern CRC generator 14.

Hence, output of the error patterns to the error pattern CRC generator 14 is finished when input of the system clock SC is finished. Almost immediately after having finished receiving the error pattern, the error pattern CRC generator 14 starts calculating the error pattern CRC, or Ej(X) X$^4$ mod Gc(X), based on the error pattern.

The second structure is different from the first structure in that "0" is not outputted to the error pattern CRC generator 14 until the minimum error location information is reached. Hence, the number of the system clocks with respect to which the error pattern CRCs are to be calculated is (code word length-minimum error location). Thus, depending on the locations of the errors, the number of the system clocks with respect to which the error pattern CRCs are to be calculated can be reduced, improving the efficiency of error pattern generation. The structure for making it possible to output the minimum error location as the load signal LD is not limited to provision of the minimum error location bus in the error correction part 4. Instead, the control circuit 40 may govern the structure so that the minimum error location information stored at the address 0 is automatically supplied to the up-counter 18 as the load signal LD.

2. Second Preferred Embodiment

2.1 Principles of Second Preferred Embodiment

The basic equation representing the principles of the first preferred embodiment, i.e., Eq. 17, can be rewritten as:

$$Rc(X) = \sum_{j=0}^{4} \{[RE_j(X) + E_j(X)]X^4 \bmod Gc(X)\} \quad (18)$$

From Eq. 18, $$Rc(X) = RE_0(X)X^4 \bmod Gc(X) + \quad (19)$$

$$\sum_{j=1}^{4} \{[RE_j(X) + E_{j-1}(X)]X^4 \bmod Gc(X)\} + E_4(X)X^4 \bmod Gc(X)$$

That is, while the first preferred embodiment requires the received CRC and the error pattern CRC to be separately calculated, the second preferred embodiment demands that the received data and the error pattern are added to obtain synthesized data from which the CRC is calculated.

2.2 Structure of Second Preferred Embodiment

FIG. 6 is a block diagram showing the structure of the error correction circuit according to the second preferred embodiment of the present invention. In FIG. 6, indicated at reference character 1 is the data buffer for storing received data which are assumed to include error to be corrected and corrected data which are obtainable by error correction. As shown in FIG. 10, the received data are in the form of data streams in which a plurality of code streams having the CRCs as internal codes and the RS codes as external codes are interleaved. The data streams are classified into a plurality of partial data streams by the code word numbers. Each partial data stream is coded to include the RS codes.

Of the received data stored in the data buffer 1, a partial data stream is given to the syndrome generator 2 and the adder 34.

The syndrome generator 2 calculates a syndrome of the RS codes based on the partial data stream.

Based on the syndrome generated by the syndrome generator 2, the error correction part 4 corrects an error in the partial data stream while storing an error location and an error value which are found in the received data in the error location and error value register 3.

The error pattern generation circuit 33 generates the error pattern of the partial data stream based on the error location and the error value which are stored in the error location and error value register 3 and outputs the error pattern to the adder 34.

The adder 34 adds the partial data stream of the received data and the error pattern to thereby generate a synthesized pattern and outputs the synthesized pattern to the CRC generator 5.

The CRC generator 5 performs CRC coding on the synthesized pattern to calculate a synthesized pattern CRC which will be then outputted to adding-function-equipped CRC register 15.

Receiving the synthesized pattern CRC, the CRC register 15 adds the data stored therein and the synthesized pattern CRC. The result is stored in the CRC register 15 as new data. Finally, the CRC register 15 outputs a total CRC of the received data as a whole.

The CRC verification part 35 compares the total CRC received from the CRC register 15 with the CRC data stored in the data buffer 1 to thereby detect whether the error correction part 4 has accurately corrected the errors.

The control circuit 40 supplies a control signal to the syndrome generator 2, the error correction part 4, the received CRC generator 5, the CRC register 15, the error pattern generation circuit 33, the adder 34 and the CRC verification part 35, and controls the operations of the same.

The control circuit 40 requires that a zero pattern is outputted from the data buffer 1 to the adder 34 after the partial data stream having the last code word number has been outputted. The control circuit 40 also requires that the zero pattern is outputted to the adder 34 when the error location and error value register 3 is initialized.

2.3 Operation in Second Preferred Embodiment

Figure 7:
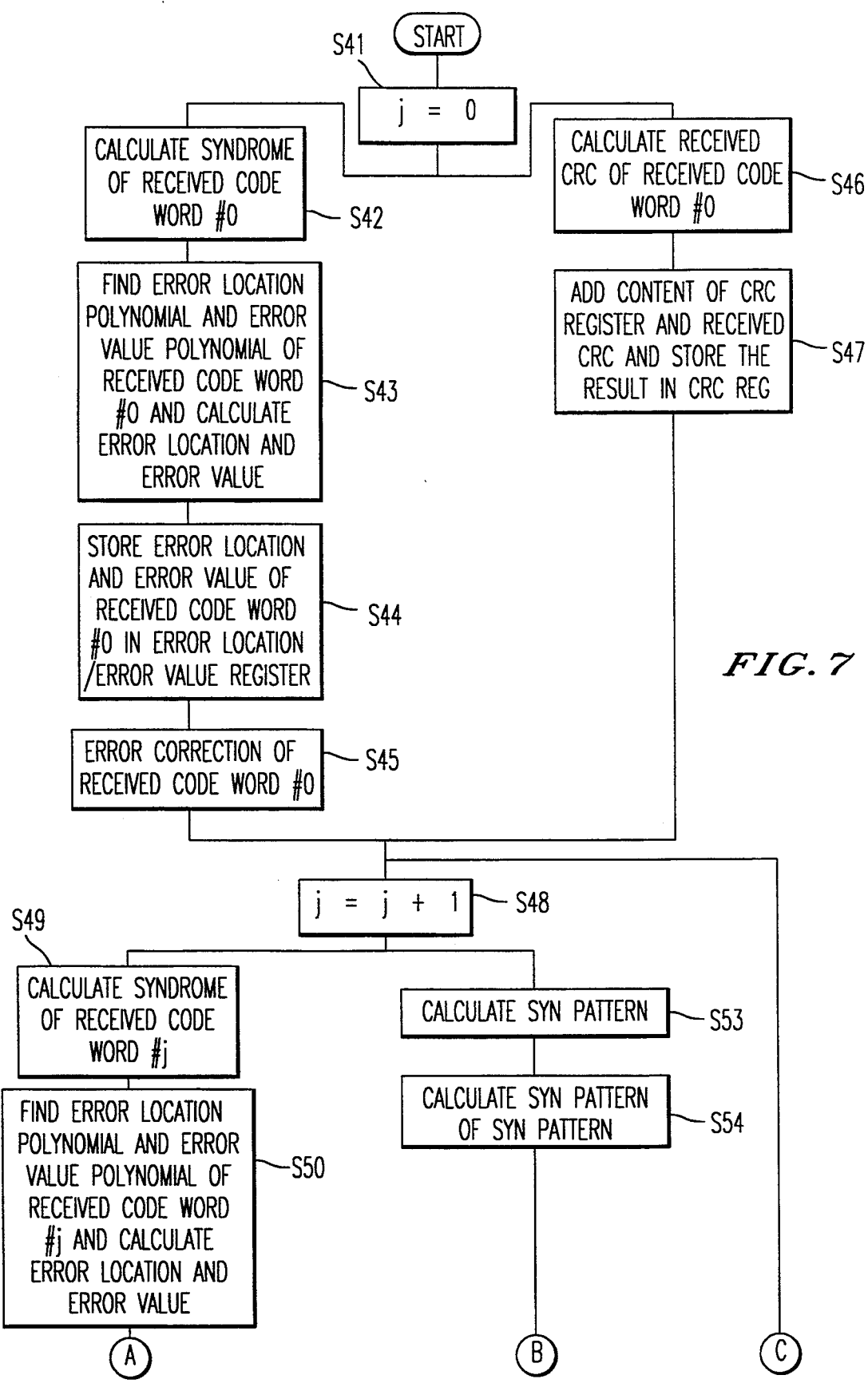
FIGS. 7 and 8 are flow charts showing the operation of the second preferred embodiment of the present invention shown in FIG. 6.
Figure 8:
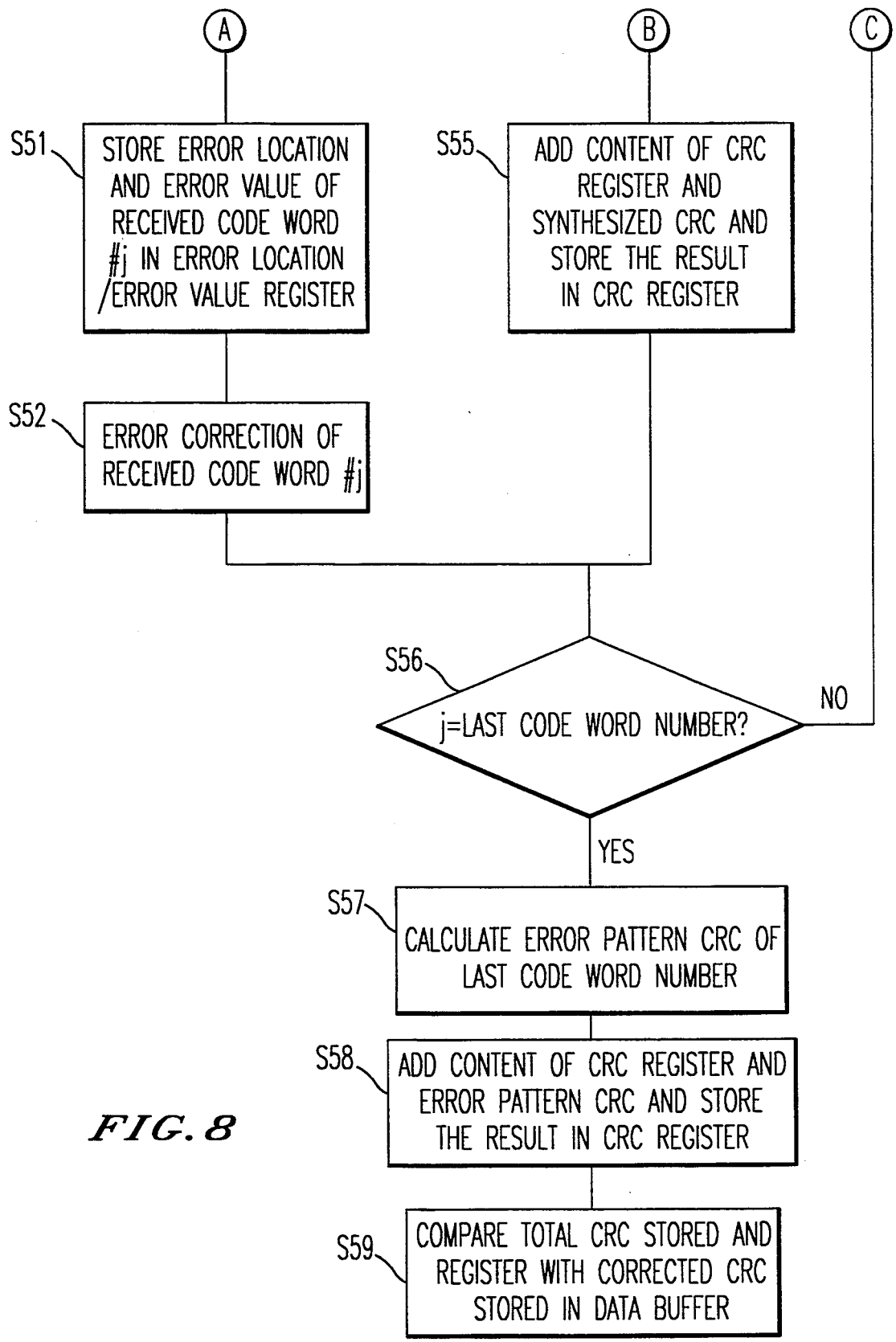

FIGS. 7 and 8 are flow charts showing the error correction performed by the error correction circuit of the second preferred embodiment shown in FIG. 6. In the following, the error correction, particularly differences from that of the first preferred embodiment, will be described with reference to FIGS. 7 and 8. The operation is performed under the control of the control circuit 40.

Prior to the error correction, data stored in the adding-function-equipped CRC register 15 are cleared to "0" and received data which may include an error to be corrected are written into the data buffer 1. The error location and error value register 3 is initialized.

At a step S41, the code word number counter j disposed in the control circuit 40 is set at zero.

At a step S42, the syndrome generator 2 calculates a syndrome of the RS codes of the partial data stream having a code word number 0 (j=0).

If an error is found, at a step S43, the error correction part 4 calculates an error location and an error value of the partial data stream having the code word number 0 based on the syndrome which was generated at the step S42. At a step S44, the error location and the error value are stored in the error location and error value register 3.

At a step S45, based on the information stored in the error location and error value register 3, the error correction part 4 serially corrects the incorrect partial data stream having the code word number 0 stored in the data buffer 1.

On the other hand, the following steps S46 to S47 are performed on a parallel basis with the steps S42 to S45.

At the step S46, the CRC generator 5 calculates the synthesized pattern CRC of the synthesized pattern which was generated by the adder 34. At this stage, the zero pattern is available from the error pattern generation circuit 33. This is therefore equal to a situation where the CRC generator 5 has calculated the received CRC of the uncorrected partial data stream which has the code word number 0 (j=0).

At the subsequent step S47, the CRC register 15 adds the data stored therein and the synthesized pattern CRC (the received CRC) which was found at the step S46. The result is stored in the CRC register 15 as new data.

It is to be noted that the step S42 and the step S46, i.e., outputting of the partial data stream which has the code word number 0 from the data buffer 1 to the adder 34, are both performed reading the partial data stream having the same code word number 0. Hence, even if the data buffer 1 is a single-port buffer, the steps S42 and S46 can be performed at the same time in synchronism by reading the partial data stream having the code word number 0 under the control of the control circuit 40.

Upon completion of the steps S42 to S45 and the steps S46 to S47, the code word number counter increments (a count=j) at a step S48.

Next, at a step S49, the syndrome generator 2 calculates a syndrome of the RS codes of the partial data stream having a code word number j.

At a step S50, the error correction part 4 calculates the error location and the error value of the partial data stream having the code word number j. At a step S51, the error location and the error value are stored in the error location and error value register 3. Following this, based on the information stored in the error location and error value register 3, the error correction part 4 serially corrects the incorrect partial data stream having the code word number j stored in the data buffer 1 at a step S52.

On the other hand, the following steps S53 to S55 are performed on a parallel basis with the steps S49 to S52.

At the step S53, the partial data stream having the code word number j is outputted from the data buffer 1 to the adder 34. At the same time, the error pattern generation circuit 33 outputs the error pattern of the partial data stream having the code word number (j-1). The adder 34 adds the partial data stream having the code word number j and the error pattern of the partial data stream having the code word number (j-1) and outputs a synthesized pattern to the CRC generator 5.

Next, at a step S54, the CRC generator 5 generates the synthesized pattern CRC of the synthesized pattern which was generated by the adder 34.

The step S49 and the step S53, i.e., outputting of the partial data stream having the code word number j from the data buffer 1 to the adder 34, are both performed reading the partial data stream having the same code word number j. Hence, even if the data buffer 1 is a single-port buffer, the steps S49 and S53 can be performed at the same time in synchronism by reading the partial data stream having the code word number j under the control of the control circuit 40.

In addition, since outputting of the error pattern of the code word number (j-1) to the adder 34 at the step S53 is performed using the data which are stored in the error location and error value register independently of the data buffer 1, the step S53 can be performed simultaneously with these steps.

When the steps S53 and S54 are completed, the sequence proceeds to a step S55 where the CRC generator 5 adds the data stored therein and the synthesized pattern CRC. The result is stored in the CRC generator 5 as new data.

After completion of the steps S49 to S52 and S53 to S55, whether the code word number count j coincides with the last code word number is decided. If the code word number count j does not coincide with the last code word number, the sequence returns to the step S48 and the steps. S48 to S55 are performed again on the code word number j at a step S56.

On the contrary, if it is judged that the code word number count j coincides with the last code word number (5 in the example shown in FIG. 10) at the step S56, the sequence proceeds to a step S57.

At the step S57, CRC generator 5 calculates the synthesized pattern CRC of the synthesized pattern which was generated by the adder 34. At this stage, the zero pattern is available from the data buffer 1. This is equal to a situation where the CRC generator 5 has calculated the received CRC of the uncorrected partial data stream which has the last code word number.

Next at a step S58, the CRC register 15 adds the data stored therein and the synthesized pattern CRC (the received CRC) which was found at the step S57. The result is stored in the CRC register 15 as new data. As a result, the data eventually stored in the CRC register 15 become equal to Rc(X) of Eq. 19. This means that the first term on the right hand side of Eq. 19 is calculated at the steps S46 to S47, the second term on the right hand side of Eq. 19 is calculated at the steps S53 to S55, and the third term on the right hand side of Eq. 19 is calculated at the steps S57 to S58.

At a step S59, the CRC verification part 35 compares the data which were stored at last in the CRC register 15 with the CRC data which were corrected by the error correction part 4 and stored in the data buffer 1 to thereby judge whether the error correction part 4 has accurately corrected the errors in the RS codes.

2.4 Effect of Second Preferred Embodiment

Similarly to the first preferred embodiment, by performing the steps S50 to S52, i.e., error correction performed by the error correction part 4 based on the syndromes (FIGS. 7 and 8), at a high speed, the time required for the error correction as a whole is reduced accordingly.

Further, in terms of timing, there is no possibility that the error location and error value register 3 will ever finish, at the step S51, storing the error location and the error value of the received data having the code word number j before the error pattern generation circuit 33 has finished generating the error pattern of the received data having the code word number (j-1) at the step S53.

2.5 Error Pattern Generation Circuit

Figure 9:
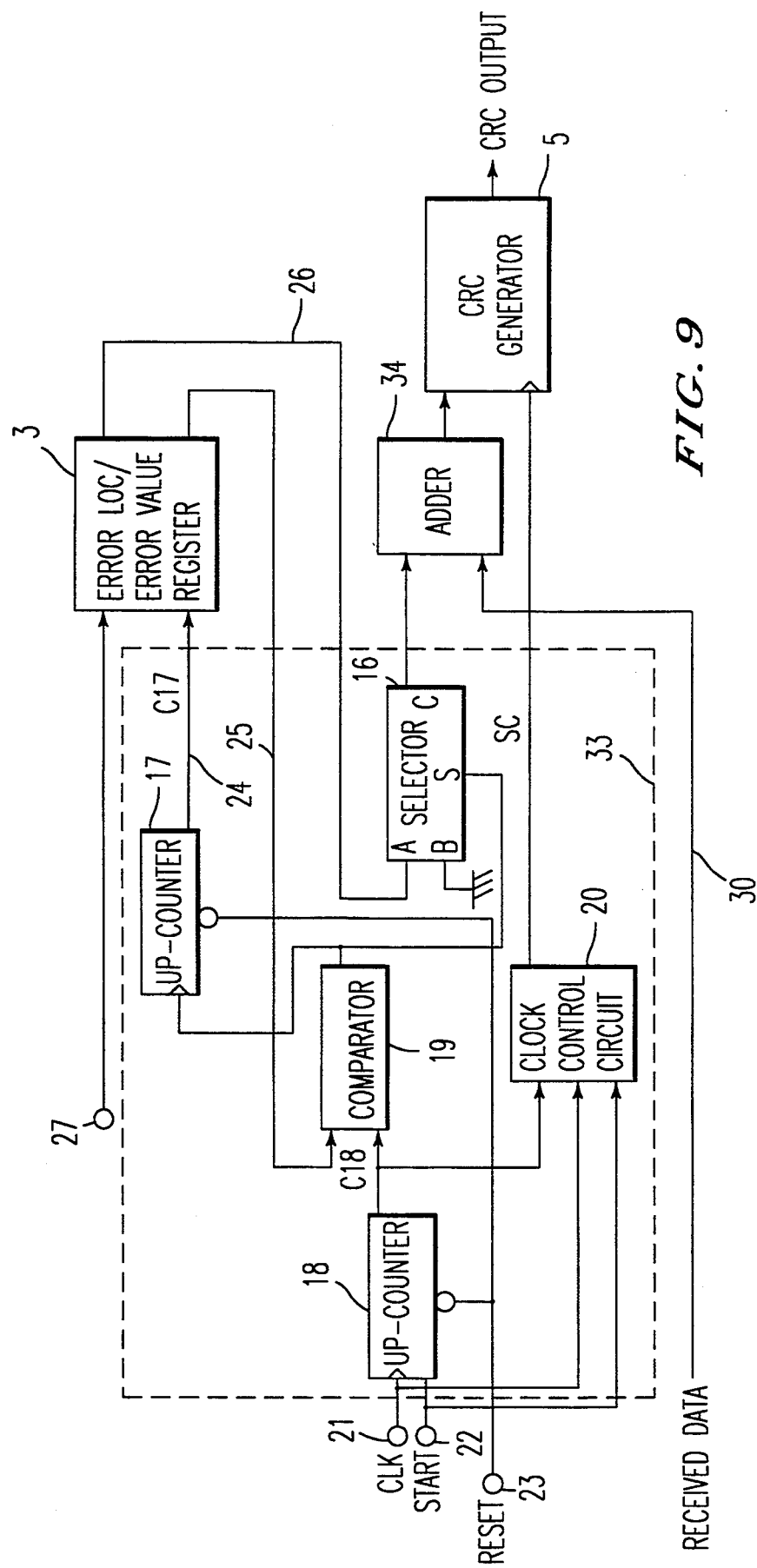
FIG. 9 is a block diagram showing the structure of an error pattern generation circuit of FIG. 6.
Figure 11:
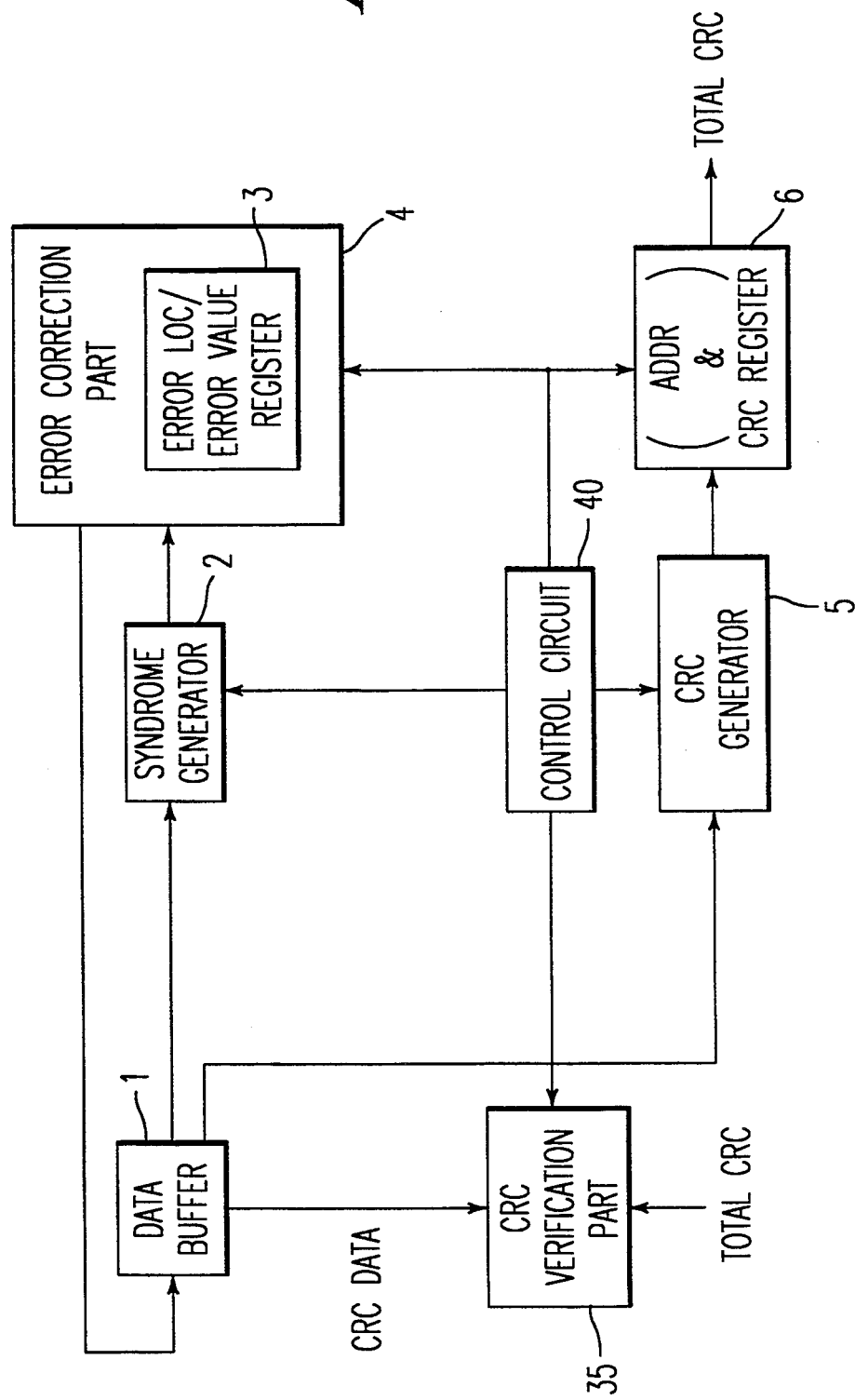
FIG. 11 is a block diagram showing the structure of a conventional error correction circuit.
Figure 12:
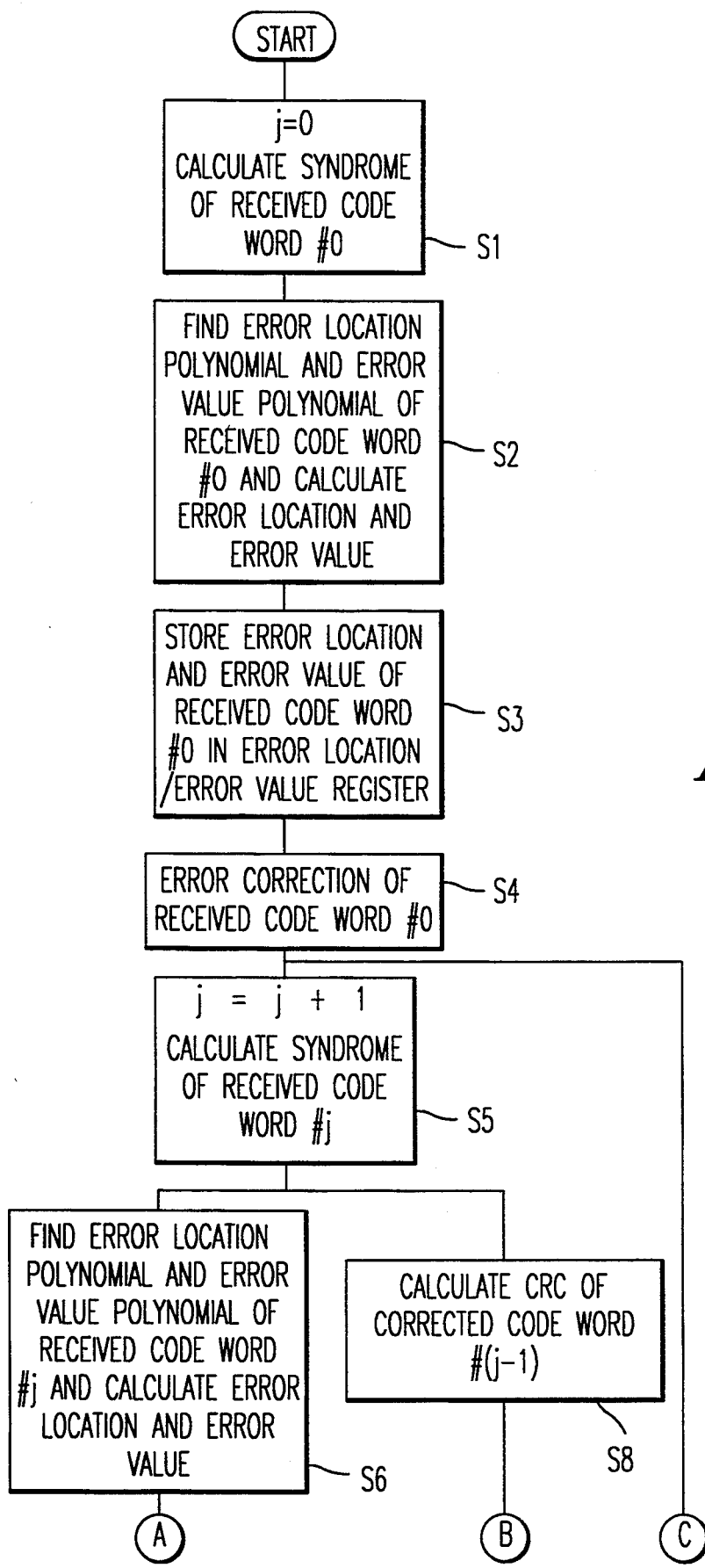
FIGS. 12 and 13 are flow charts showing the operation of the conventional error correction circuit.
Figure 13:
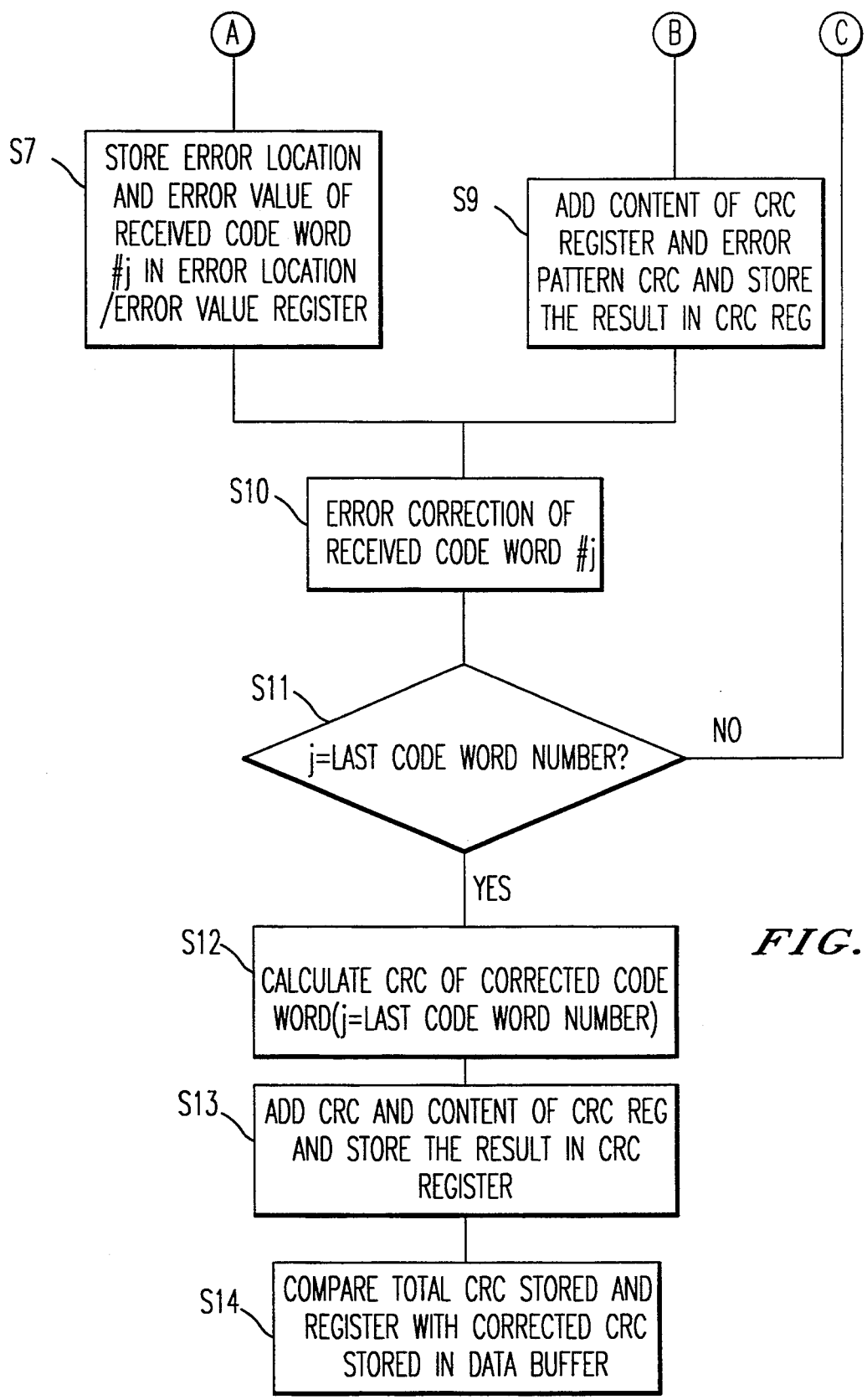
Figure 14:
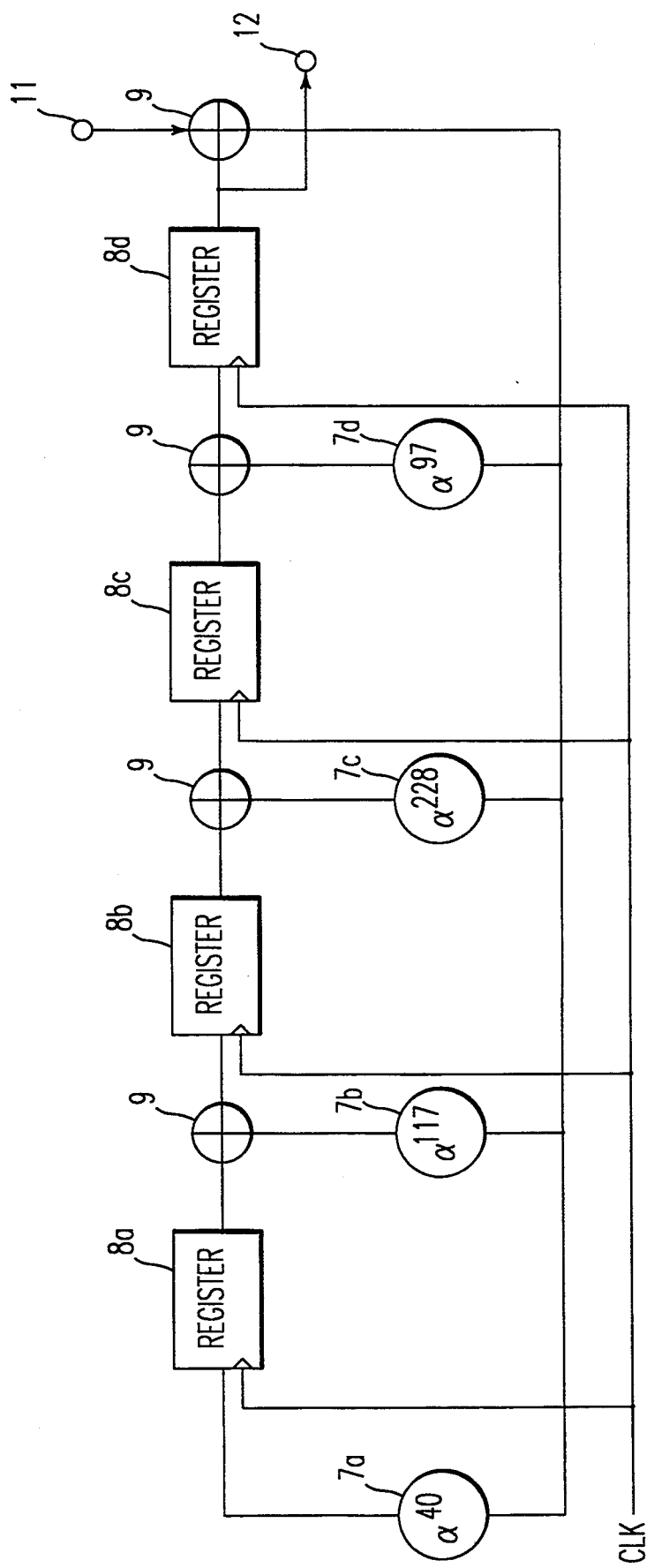
FIG. 14 is a block diagram showing the structure of a CRC circuit.

FIG. 9 is a block diagram showing the structure of the error pattern generation circuit which is used in the second preferred embodiment. As shown in FIG. 9, the output C of the selector 16 is fed to the adder 34. A partial data stream having a certain code word number is also given to the adder 34 from the data buffer 1 through the received data bus 30. The adder 34 adds the partial data stream and the error pattern to generate a synthesized pattern which will be then outputted to the CRC generator 5.

Upon receipt of the start signal START, the clock control circuit 20, to which the count signal C18 from the up-counter 18 is supplied, outputs the system clock SC to the CRC generator 5 in synchronism with the system clock CLK. Supply of the system clock SC to the CRC generator 5 from the clock control circuit 20 is continued until a predetermined count is reached by a count expressed by the count signal C18 of the up-counter 18.

The error pattern generation circuit of the second preferred embodiment has an otherwise similar structure to that of the error pattern generation circuit 33 of the first preferred embodiment (FIG. 4), and therefore, similar description will be omitted.

In the error pattern generation circuit 33 having such a construction, likewise in the error pattern generation circuit 33 having the first structure of the first preferred embodiment, the selector 16 outputs the error pattern signals as 0, A, 0, B, 0, 0, C, . . . to the adder 34.

When the count indicated by the count signal C18 from the up-counter 18 reaches the code word length, the clock control circuit 20 stops supplying the system clock SC to the CRC generator 5 to thereby end entry of the synthesized pattern into the CRC generator 5.

Hence, output of the synthesized pattern to the CRC generator 5 is finished when input of the system clock SC is finished. Almost immediately after having finished receiving the synthesized pattern, the CRC generator 5 starts creating a synthesized pattern CRC.

While the invention has been described in detail, the foregoing description is in all aspects illustrative and not restrictive. It is understood that numerous other modifications and variations can be devised without departing from the scope of the invention.

We claim:

1. An error correction circuit comprising:

(a) a data buffer for storing a data stream in which a plurality of RS codes for correcting an error in data and CRC codes for detecting an error in said data are interleaved, said data stream being formed by a first to an n-th partial data streams each processed by RS coding, said data streams including CRC data preliminarily generated by CRC coding;

(b) syndrome generation means for generating syndromes of RS codes in accordance with said partial data streams which have not been corrected yet;

(c) first CRC coding means for performing CRC coding on said partial data streams which have not been corrected yet to thereby obtain first CRCs;

(d) error correction means for calculating error locations and error values of said partial data streams in accordance with said syndromes and for correcting errors in said partial data streams in accordance with said error locations and said error values;

(e) second CRC coding means for generating error patterns of said partial data streams in accordance with said error locations and said error values, coding CRCs of said error patterns and for obtaining second CRCs;

(f) adding means for receiving said first or said second CRCs and calculating a total CRC which is a sum of said first or said second CRCs of said partial data streams;

(g) CRC verification means for comparing said total CRC with said CRC data of said data stream and for verifying whether said means (d) has performed error correction accurately; and (h) control means for controlling said means (b) to (g) so that the said first to said n-th partial data streams are serially processed and generation of a syndrome performed by said means (b) based on a j-th partial data stream ($2 \leq j \leq n$), CRC coding on said j-th partial data stream performed by said means (c) and CRC coding on an error pattern of a (j-1)-th partial data stream performed by said means (e) are carried out simultaneously, and so that said means (g) performs verification after said means (e) has finished CRC coding on an error pattern of said n-th partial data stream.

2. The error correction circuit of claim 1, wherein said error correction means (d) comprises (d-1) memory means for storing each error location and the corresponding error value as a pair of information, and wherein said second CRC coding means (e) comprises:

(e-1) error pattern generation means for generating said error patterns in accordance with said error locations and said error values which are stored in said memory means (d-1); and (e-2) error pattern CRC coding means for performing CRC coding on said error patterns and outputting said second CRCs.

3. The error correction circuit of claim 2, wherein said memory means (d-1) stores said error locations and said error values so that said error locations are stored at addresses in an ascending order of address, and wherein said error pattern generation means (e-1) comprises:

(e-1-1) means for serially counting up a location count from an initial location count which indicates the beginning of each partial data stream;

(e-1-2) means for outputting a count control signal in accordance with one of said error locations outputted from said memory means (d-1) and said location count, said count control signal consisting of a coincidence and a no-coincidence signals;

(e-1-3) means for counting up an address count from an initial address count, which is a count indicating an address beginning location of said memory means (d-1), when said count control signal is said coincidence signal and for outputting said address count to an address input part of said memory means (d-1) so that said memory means (d-1) outputs one of said error locations and the corresponding error value which are stored at an address which is designated by said address count; and (e-1-4) selection means for outputting an error pattern signal which forms said error patterns, said corresponding error values being outputted as said error pattern signal when said count control signal is said coincidence signal, a zero signal indicating a logical value "0" being outputted as said error pattern signal when said count control signal is said no-coincidence signal.

4. The error correction circuit of claim 3, wherein said error pattern generation means (e-1) further comprises (e-1-5) means for controlling entry of said error patterns into said error pattern CRC coding means (e-2) in accordance with said location count.

5. The error correction circuit of claim 4, wherein said means (e-1-1) is an up-counter in which said initial location count is set when an external reset signal is received therein and which counts up said location count in synchronism with said external clock signal.

6. The error correction circuit of claim 5, wherein said means (e-1-2) is a comparator which receives one of said error locations from said memory means (d-1) as a first input thereto and said location count as a second input thereto, said comparator comparing said first input with said second input and outputting the result as said count control signal.

7. The error correction circuit of claim 6, wherein said means (e-1-3) is an up-counter in which said initial address count is set when said external reset signal is received therein and which counts up said address count in synchronism with said coincidence signal of said count control signal.

8. The error correction circuit of claim 7, wherein said means (e-1-5) is a clock control circuit which receives said external clock signal and supplies a clock signal to said error pattern CRC coding means (e-2) in accordance with said external clock signal, supply of said clock signal to said error pattern CRC coding means (e-2) being controlled in accordance with said location count.

9. The error correction circuit of claim 2, wherein said memory means (d-1) stores said error locations and said error values at addresses in an ascending order of address, and wherein said error pattern generation means (e-1) comprises:

(e-1-1) means for serially counting up a location count from an initial location count, said initial location count being a minimum location count which indicates a minimum error location of said error locations which are stored in said memory means (d-1);

(e-1-2) means for outputting a count control signal in accordance with one of said error locations outputted from said memory means (d-1) and said location count, said count control signal consisting of a coincidence and a no-coincidence signals;

(e-1-3) means for counting up an address count from an initial address count, which is a count indicating an address beginning location of said memory means (d-1), when said count control signal is said coincidence signal and for outputting said address count to an address input part of said memory means (d-1) so that said memory means (d-1) outputs one of said error locations and the corresponding error value which are stored at an address which is designated by said address count; and (e-1-4) selection means for outputting an error pattern signal which forms said error patterns, said corresponding error values being outputted as said error pattern signal when said count control signal is said coincidence signal, a zero signal indicating a logical value "0" being outputted as said error pattern signal when said count control signal is said no-coincidence signal.

10. The error correction circuit of claim 9, wherein said means (e-1-1) is an up-counter in which said initial location count is set when a data load signal which indicates said minimum location count is received therein and which counts up said location count in synchronism with an external clock signal.

11. The error correction circuit of claim 10, wherein said error correction means (d) is equipped with a function of outputting said minimum location count as said data load signal.

12. An error correction circuit comprising:
(a) a data buffer for storing a data stream in which a plurality of RS codes for correcting an error in data and CRC codes for detecting an error in said data are interleaved, said data stream being formed by a first to an n-th partial data streams each processed by RS coding, said data streams including CRC data preliminarily generated by CRC coding;
(b) syndrome generation means for generating syndromes of RS codes in accordance with said partial data streams which have not been corrected yet;
(c) error correction means for calculating error locations and error values of said partial data streams in accordance with said syndromes and for correcting errors in said partial data streams in accordance with said error locations and said error values;
(d) pattern synthesizing means for generating error patterns of said partial data streams in accordance with said error locations and said error values and for adding said error patterns and said partial data streams which have not been corrected yet to output synthesized patterns;
(e) synthesized CRC coding means for performing CRC coding on said synthesized patterns to thereby obtain synthesized CRCs;
(f) means for serially receiving said synthesized CRCs and adding up the same to thereby obtain a total CRC;
(g) CRC verification means for comparing said total CRC with said CRC data of said data stream and for verifying whether said means (d) has performed error correction accurately; and
(h) control means for controlling said means (b) to (g) so that the said first to said n-th partial data streams are serially processed and generation of a syndrome performed by said means (b) based on a j-th partial data stream ($2 \leq j \leq n$) and adding up of said j-th partial data stream and said error pattern of said (j-1)-th partial data stream are carried out simultaneously, and so that said means (g) performs verification after said means (e) has finished CRC coding on the last one of said synthesized patterns.

13. The error correction circuit of claim 12, wherein said error correction means (c) comprises
(c-1) memory means for storing each error location and the corresponding error value as a pair of information,
and wherein said pattern synthesizing means (d) comprises:
(d-1) error pattern generation means for generating said error patterns in accordance with said error locations and said error values which are stored in said memory means (c-1); and
(d-2) adding means for receiving and adding up said error patterns and said partial data streams which have not been corrected yet to thereby output synthesized patterns.

14. The error correction circuit of claim 13, wherein said control means (h) controls such that one of said error patterns which is given to said adding means (d-2) at the same time that said adding means (d-2) receives said first partial data stream which has not been corrected yet is a zero pattern which is formed by a logical value "0" and that said partial data stream which is given to said adding means (d-2) at the same time that said adding means (d-2) receives said error pattern of said n-th partial data stream is said zero pattern.

15. The error correction circuit of claim 13,
wherein said memory means (c-1) stores said error locations and said error values at addresses in an ascending order of address,
and wherein said error pattern generation means (d-1) comprises:
(d-1-1) means for counting up means for serially counting up a location count from an initial count which indicates the beginning of each partial data stream;
(d-1-2) means for outputting a count control signal in accordance with one of said error locations outputted from said memory means (c-1) and said location count, said count control signal consisting of a coincidence and a no-coincidence signals;
(d-1-3) means for counting up an address count from an initial count, which is a count indicating an address beginning location of said memory means (c-1), when said count control signal is said coincidence signal and for outputting said address count to an address input part of said memory means (c-1) so that said memory means (c-1) outputs one of said error locations and the corresponding error value which are stored at an address which is designated by said address count; and
(d-1-4) selection means for outputting an error pattern signal which forms said error patterns, said corresponding error value being outputted as said error pattern signal when said count control signal is said coincidence signal, a zero signal indicating a logical value "0" being outputted as said error pattern signal when said count control signal is said no-coincidence signal.

* * * * *